(12) United States Patent
Young et al.

(10) Patent No.: US 10,105,875 B2
(45) Date of Patent: Oct. 23, 2018

(54) ENHANCED SURFACES, COATINGS, AND RELATED METHODS

(75) Inventors: Michael Eugene Young, Emeryville, CA (US); Alexander Chow Mittal, Berkeley, CA (US); Arjun Daniel Srinivas, San Francisco, CA (US); Calvin Peng, Chicago, IL (US)

(73) Assignee: CAM Holding Corporation, Tortola (VG)

( * ) Notice: Subject to any disclaimer, the term of this patent is extended or adjusted under 35 U.S.C. 154(b) by 114 days.

(21) Appl. No.: 13/059,963

(22) PCT Filed: Aug. 21, 2009

(86) PCT No.: PCT/US2009/054655
§ 371 (c)(1),
(2), (4) Date: May 10, 2011

(87) PCT Pub. No.: WO2010/022353
PCT Pub. Date: Feb. 25, 2010

(65) Prior Publication Data
US 2011/0217544 A1  Sep. 8, 2011

Related U.S. Application Data

(60) Provisional application No. 61/189,540, filed on Aug. 21, 2008, provisional application No. 61/203,661, filed on Dec. 26, 2008.

(51) Int. Cl.
*B05D 3/04* (2006.01)
*B29C 37/00* (2006.01)
(Continued)

(52) U.S. Cl.
CPC .......... *B29C 37/0032* (2013.01); *B29C 70/64* (2013.01); *B29C 71/0009* (2013.01);
(Continued)

(58) Field of Classification Search
CPC .................................................. B29C 37/0032
(Continued)

(56) References Cited

U.S. PATENT DOCUMENTS 3,751,287 A    8/1973  Baier et al.
3,849,284 A    11/1974 Kossman
(Continued)

FOREIGN PATENT DOCUMENTS

CN    101427357     5/2009
CN    101589473     11/2009
(Continued)

OTHER PUBLICATIONS

Starostina et al., Part II: Sample Preparation for AFM Particle Characterization, Pacific Nanotechnology Inc., Jan. 16, 2006.*
(Continued)

*Primary Examiner* — Tabatha L Penny

(57) ABSTRACT

A method of modifying a coating material includes applying a fluid including a population of particles to a wet coating material disposed on a substrate. The method also includes drying the wet coating material so as to give rise to a coated article, where the particles are at least partially embedded in a surface of the dried coating material. The particles can be metallic nanowires, and a loading of the metallic nanowires in the dried coating material can be above an electric percolation threshold.

35 Claims, 15 Drawing Sheets

(51) Int. Cl.
*B29C 70/64* (2006.01)
*B29C 71/00* (2006.01)

(52) U.S. Cl.
CPC .............. *B29C 2071/0018* (2013.01); *B29C 2071/0054* (2013.01); *Y10T 428/25* (2015.01); *Y10T 428/254* (2015.01)

(58) Field of Classification Search
USPC ....................................................... 427/336
See application file for complete search history.

(56) References Cited

U.S. PATENT DOCUMENTS

| | | | | |
|---|---|---|---|---|
| 4,391,278 | A | * | 7/1983 | Cahalan et al. ............... 600/391 |
| 4,419,479 | A | * | 12/1983 | Springer ....................... 524/413 |
| 4,604,427 | A | | 8/1986 | Roberts et al. |
| 5,071,221 | A | | 9/1991 | Fujitani et al. |
| 5,071,800 | A | | 12/1991 | Iwamoto et al. |
| 5,212,017 | A | | 5/1993 | Meder |
| 5,368,894 | A | | 11/1994 | Lammers et al. |
| 5,474,814 | A | | 12/1995 | Komatsu et al. |
| 5,492,769 | A | * | 2/1996 | Pryor et al. .................. 428/552 |
| 5,643,256 | A | | 7/1997 | Urueta |
| 5,656,222 | A | * | 8/1997 | Berry et al. .................. 264/131 |
| 5,878,153 | A | | 3/1999 | Mikulec et al. |
| 5,879,740 | A | | 3/1999 | Miyazaki |
| 5,879,741 | A | | 3/1999 | Itoh |
| 6,156,550 | A | | 12/2000 | Glad |
| 6,187,448 | B1 | | 2/2001 | Hanoka et al. |
| 6,236,493 | B1 | * | 5/2001 | Schmidt et al. .............. 359/296 |
| 6,248,342 | B1 | | 6/2001 | Trogolo et al. |
| 6,383,397 | B1 | | 5/2002 | Kojima et al. |
| 6,409,725 | B1 | | 6/2002 | Khandkar et al. |
| 6,602,932 | B2 | | 8/2003 | Feldheim et al. |
| 6,881,448 | B1 | * | 4/2005 | Hattori ......................... 427/307 |
| 6,882,051 | B2 | | 4/2005 | Marjumdar et al. |
| 7,160,297 | B2 | * | 1/2007 | Nesbitt ......................... 606/45 |
| 7,642,463 | B2 | | 1/2010 | Guiheen et al. |
| 7,785,557 | B2 | | 8/2010 | Gruner et al. |
| 7,842,432 | B2 | | 11/2010 | Niu et al. |
| 7,849,424 | B2 | | 12/2010 | Wolk et al. |
| 7,863,760 | B2 | | 1/2011 | Daniels et al. |
| 7,960,027 | B2 | | 6/2011 | Guiheen et al. |
| 7,963,760 | B2 | | 6/2011 | Cho et al. |
| 8,018,568 | B2 | | 9/2011 | Allemand et al. |
| 8,049,333 | B2 | | 11/2011 | Alden et al. |
| 8,094,247 | B2 | | 1/2012 | Allemand et al. |
| 8,138,568 | B2 | | 3/2012 | Yoon et al. |
| 8,174,667 | B2 | | 5/2012 | Allemand et al. |
| 8,294,025 | B2 | | 10/2012 | Fonash et al. |
| 8,460,747 | B2 | | 6/2013 | Veerasamy |
| 8,466,366 | B2 | | 6/2013 | Srinivas et al. |
| 8,518,472 | B2 | | 8/2013 | Veerasamy |
| 8,530,262 | B2 | | 9/2013 | Van Duren et al. |
| 8,604,332 | B2 | | 12/2013 | Veerasamy |
| 8,609,975 | B2 | | 12/2013 | Veerasamy |
| 8,749,009 | B2 | | 6/2014 | Young et al. |
| 8,852,689 | B2 | | 10/2014 | Srinivas et al. |
| 9,185,798 | B2 | | 11/2015 | Young et al. |
| 2002/0115747 | A1 | | 8/2002 | Feldheim et al. |
| 2002/0119251 | A1 | | 8/2002 | Chen et al. |
| 2002/0175408 | A1 | | 11/2002 | Majumdar et al. |
| 2003/0129415 | A1 | | 7/2003 | Rasmussen et al. |
| 2003/0157354 | A1 | | 8/2003 | Vanveghel et al. |
| 2003/0203207 | A1 | | 10/2003 | Pessey et al. |
| 2004/0095658 | A1 | | 5/2004 | Buretea et al. |
| 2004/0143263 | A1 | | 7/2004 | Schechter et al. |
| 2004/0166166 | A1 | | 8/2004 | Matsunami et al. |
| 2004/0169151 | A1 | | 9/2004 | Yagi et al. |
| 2005/0233504 | A1 | | 10/2005 | Doi et al. |
| 2006/0038182 | A1 | | 2/2006 | Rogers et al. |
| 2006/0068025 | A1 | | 3/2006 | Chang et al. |
| 2006/0111008 | A1 | | 5/2006 | Arthur et al. |
| 2006/0112858 | A1 | | 6/2006 | Nguyen |
| 2006/0115536 | A1 | | 6/2006 | Yacaman et al. |
| 2006/0194037 | A1 | | 8/2006 | Fink et al. |
| 2006/0235087 | A1 | | 10/2006 | Alexandridis et al. |
| 2006/0257637 | A1 | | 11/2006 | Pereira et al. |
| 2006/0257638 | A1 | | 11/2006 | Glatkowski et al. |
| 2006/0269864 | A1 | | 11/2006 | Tarnawskyj et al. |
| 2007/0065651 | A1 | | 3/2007 | Glatkowski et al. |
| 2007/0074316 | A1 | * | 3/2007 | Alden .................... B82Y 30/00 257/784 |
| 2007/0093181 | A1 | | 4/2007 | Lugg et al. |
| 2007/0104605 | A1 | | 5/2007 | Hampden-Smith et al. |
| 2007/0153353 | A1 | | 7/2007 | Gruner |
| 2007/0158611 | A1 | | 7/2007 | Oldenburg |
| 2007/0196650 | A1 | | 8/2007 | Yamamoto et al. |
| 2007/0264481 | A1 | | 11/2007 | Desimone et al. |
| 2007/0275230 | A1 | | 11/2007 | Murphy et al. |
| 2007/0298253 | A1 | | 12/2007 | Hata et al. |
| 2008/0143906 | A1 | * | 6/2008 | Allemand et al. .............. 349/43 |
| 2008/0152870 | A1 | | 6/2008 | Takada et al. |
| 2008/0193634 | A1 | | 8/2008 | Yaniv et al. |
| 2008/0259262 | A1 | | 10/2008 | Jones et al. |
| 2008/0276987 | A1 | | 11/2008 | Flood |
| 2009/0095341 | A1 | | 4/2009 | Pfenninger et al. |
| 2009/0129004 | A1 | | 5/2009 | Gruner |
| 2009/0188697 | A1 | | 7/2009 | Guiheen et al. |
| 2009/0229652 | A1 | | 9/2009 | Mapel et al. |
| 2009/0275143 | A1 | | 11/2009 | Misra et al. |
| 2010/0012190 | A1 | | 1/2010 | Goto et al. |
| 2010/0197068 | A1 | | 8/2010 | Poon et al. |
| 2010/0230344 | A1 | | 9/2010 | Srinivas et al. |
| 2010/0273060 | A1 | | 10/2010 | Yang et al. |
| 2011/0139253 | A1 | | 6/2011 | Wachi et al. |
| 2011/0162711 | A1 | | 7/2011 | Takeuchi et al. |
| 2011/0217544 | A1 | | 9/2011 | Young et al. |
| 2011/0281070 | A1 | | 11/2011 | Mittal et al. |
| 2012/0055013 | A1 | | 3/2012 | Finn |
| 2012/0094090 | A1 | | 4/2012 | Yamazaki et al. |
| 2012/0098419 | A1 | | 4/2012 | Chiba et al. |
| 2012/0132930 | A1 | | 5/2012 | Young et al. |
| 2012/0273262 | A1 | | 11/2012 | Chu |
| 2013/0000952 | A1 | | 1/2013 | Srinivas et al. |
| 2013/0014980 | A1 | | 1/2013 | Takeda et al. |
| 2013/0277625 | A1 | | 10/2013 | Srinivas et al. |
| 2013/0319729 | A1 | | 12/2013 | Poon et al. |
| 2013/0341074 | A1 | | 12/2013 | Virkar et al. |
| 2014/0014171 | A1 | | 1/2014 | Alam et al. |

FOREIGN PATENT DOCUMENTS

| | | |
|---|---|---|
| JP | 07-202243 | 8/1995 |
| JP | 08-157743 | 6/1996 |
| JP | 2008-157743 A | 6/1996 |
| JP | 2007-530741 | 1/2007 |
| JP | 2007-229989 | 9/2007 |
| JP | 2008-157743 A | 7/2008 |
| JP | 2008-200613 | 9/2008 |
| JP | 2008-288333 | 11/2008 |
| JP | 2009-063744 | 3/2009 |
| JP | 2009-512122 | 3/2009 |
| JP | 2009-526132 A | 7/2009 |
| JP | 2009-541088 | 11/2009 |
| JP | 2010-258020 | 11/2010 |
| KR | 10-1997-0701751 A | 4/1997 |
| KR | 10-2004-0012298 A | 2/2004 |
| KR | 10-0669237 B1 | 1/2007 |
| KR | 10201170541 | 6/2011 |
| KR | 10-2008-0066658 | 12/2013 |
| WO | WO-01/18734 | 3/2001 |
| WO | WO-2004/069736 | 8/2004 |
| WO | WO-2005/061598 A1 | 7/2005 |
| WO | WO-2005/089480 A2 | 9/2005 |
| WO | WO-2005/089480 A3 | 9/2005 |
| WO | WO-2005/116757 | 12/2005 |
| WO | WO-2006/030981 | 3/2006 |
| WO | WO-2007/003516 A2 | 1/2007 |
| WO | WO-2007/022226 | 2/2007 |
| WO | WO-2007/031446 | 3/2007 |
| WO | WO-2007/039227 A1 | 4/2007 |
| WO | WO-2007/095058 A2 | 8/2007 |
| WO | WO2008/150867 | 12/2008 |

(56) References Cited

FOREIGN PATENT DOCUMENTS

| WO | WO-2009/063744 | 5/2009 |
| WO | WO-2009/148131 | 12/2009 |
| WO | WO-2010/010838 | 1/2010 |
| WO | WO-2007/013871 | 2/2010 |
| WO | WO-2010/018734 | 2/2010 |
| WO | WO2010/022353 | 2/2010 |
| WO | WO-2010/030374 | 3/2010 |
| WO | WO-2010-150619 | 12/2010 |
| WO | WO-2011/106438 | 9/2011 |
| WO | WO2011/106730 | 9/2011 |
| WO | WO2012/021460 | 2/2012 |

OTHER PUBLICATIONS

Chi, Antibacterial activity of anodized aluminum with deposited silver, Surface and Coatings Technology, 157 (2002), p. 162-165.*
Lee, Solution-Processed Metal Nanowire Mesh Transparent Electrodes, Nano Letters, 2008, vol. 8 No. 2, p. 689-692.*
Hu et al. "Scalable coating and properties of transparent, flexible, silver nanowire electrodes." ACS Nano vol. 4:5, 2955-2963 (Apr. 28, 2010).
U.S. Appl. No. 13/536,968, filed Jun. 28, 212, Srinivas et al.
U.S. Appl. No. 13/537,177, filed Jun. 28, 212, Srinivas et al.
PCT/US2011/026362, International Search Report and Written Opinion dated Oct. 10, 2011.
PCT/US2009/054655, International Search Report & Written Opinion dated Oct. 19, 2009.
U.S. Appl. No. 13/035,888, filed Feb. 25, 2011, Office Action dated Dec. 22, 2011.
U.S. Appl. No. 13/035,888, filed Feb. 25, 2011, Office Action dated Jul. 19, 2012.
U.S. Appl. No. 13/035,888, filed Feb. 25, 2011, Advisory Action dated Oct. 5, 2012.
Notice of Reasons for Rejection from Japanese Application No. 2011-524032.
Final Office Action received for U.S. Appl. No. 13/035,888 dated Nov. 5, 2013.
First Office Action received for CN Appln. 200980140882.9 dated Jul. 6, 2012.
Non-final Office Action received for U.S. Appl. No. 13/055,888 dated Jan. 16, 2013.
Notice of Allowance received for U.S. Appl. No. 13/205,526 dated Jan. 30, 2014.
Notice of Reasons for Rejection received for Japan Patent Application No. 2011-524032 dated Dec. 17, 2014.
Notification of Grant for China Patent Application No. 200980140882.9; dated Feb. 17, 2014; 3 pages.
Office Action for Japan Patent Application No. 2011-524032; dated Dec. 22, 2014.
Office Action received for China Patent Application No. 200980140882.9 dated Feb. 17, 2013.
Notice of Reasons for Rejection received for Japan Patent Application No. 2011-524032 dated Jun. 18, 2014.
Office Action received for China Patent Application No. 200980140882.9 dated Sep. 3, 2013.
Decision of Rejection received in Japanese Patent Application No. 2011-524032 dated Aug. 12, 2015, 2 pages with English Translation.
Final Office Action received for U.S. Appl. No. 14/247,033 dated Sep. 1, 2015, 21 pages.
Final Office Action received for U.S. Appl. No. 14/522,080 dated Aug. 25, 2015, 41 pages.
Non-Final Office Action received for U.S. Appl. No. 14/873,567 dated Nov. 23, 2015, 13 pages.
Notice of Allowance received in U.S. Appl. No. 14/299,938 dated Sep. 4, 2015, 14 pages.
Preliminary Rejection received for Korean Patent Application No. 10-2011-7006533 dated Oct. 20, 2015, 23 pages with English translation.
English Translation of Second Notice of Reasons for Rejection on Japanese Application No. 2011-524032 dated Aug. 26, 2013, 4 pages.
Examination Report on Australian Application 2009282691, dated Apr. 22, 2015.
International Preliminary Report on Patentability on International Application No. PCT/US2008/065083 dated Sep. 17, 2009.
International Preliminary Report on Patentability on International Application No. PCT/US2009/054655 dated Oct. 3, 2011, 58 pages.
Non-Final Office Action on U.S. Appl. No. 14/522,080, dated May 7, 2015.
Non-Final Office Action on U.S. Appl. No. 13/035,888 dated Jun. 7, 2013, 27 pages.

* cited by examiner

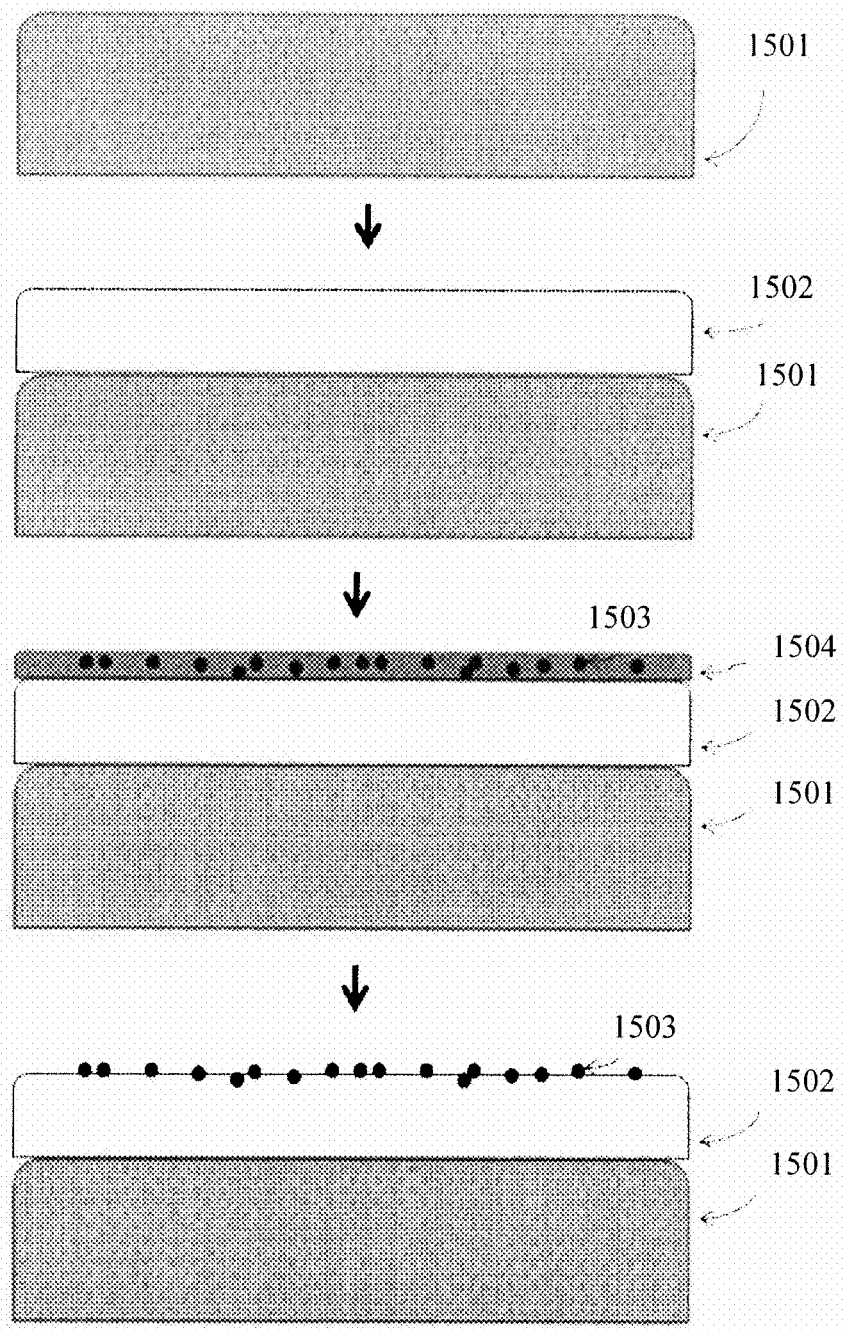

ENHANCED SURFACES, COATINGS, AND RELATED METHODS

RELATED APPLICATIONS

The present invention claims the benefit of U.S. Application No. 61/189,540 (filed Aug. 21, 2008) and U.S. Application No. 61/203,661 (filed Dec. 26, 2008), and PCT Application PCT/US2008/065083 (filed May 29, 2008), the entireties of which are incorporated herein by reference.

TECHNICAL FIELD

The present application relates to the fields of molded articles and to the application of coating materials.

BACKGROUND

Direct or bulk incorporation and compounding methods are widely used in industry to treat polymeric objects with performance enhancing additives, resulting in the additive being dispersed throughout the bulk of the material. The term "additives" conventionally refers to chemicals and materials that are incorporated either into masterbatches or directly into resin mixes via direct compounding for bulk incorporation (additives for plastics) or into solutions for coatings (additives for coatings).

Reducing the amount of additives throughout the bulk of the polymer, however, results in a proportional reduction of the additive population at the polymer surface, which in many cases is where the additives' interactions with the environment external to the surface is most crucial. Thus, bulk incorporation methods are not particularly efficient at minimizing the amount of additives used to achieve a particular level of surface enhancement required from the material. Furthermore, additives at a surface of a material into which they have been mixed often have their activity or effect at least partially inhibited by the presence of excess material around them.

Bulk incorporation is inefficient in that while the goal of the method for surface enhancement is to produce a substrate having particles on the surface, a large number of particles are also dispersed within the substrate. Thus, in bulk incorporation, a large number of particles are effectively buried within the substrate and can not be presented to the environment exterior to the substrate. As a result, a comparatively large number of particles are needed to functionalize the surfaces of a given substrate by way of bulk incorporation. Also, achieving uniform dispersion of particles within the substrate is difficult, but may nevertheless be necessary for uniform surface area coverage of the particles.

In addition, melt-mixing polymers with their additives during bulk incorporation often necessitates high temperatures, which is energy inefficient, requires complex multi-step processes to controllably heat and cool the polymer melt, can decompose the additives, or can unfavorably denature or damage the polymers themselves. Uniform and homogenous dispersion of the additives throughout the polymer bulk can be in many applications difficult to achieve in melt-mixing and other forms of mixing, as phase separation or particle flocculation and agglomeration may occur.

Surface coatings containing these performance enhancing additives may alternatively be used to achieve similar goals of modifying the surface properties of the substrate material. Surface coating methods, however, suffer from complex application and curing steps, thermal expansion incompatibility, peeling, and various other disadvantages.

Use of a coating process to make a functionalized surface can involve multiple additional manufacturing steps, including surface pretreatment, priming, and curing. Second, the coating layer must sufficiently adhere or bind to the underlying substrate so as to avoid detachment from the substrate, which is especially challenging for polymer substrates. Proper execution of coating-based techniques may require significant research and development commitments, and may also require additional primer layers or surface treatments. Third, the coating layers are generally substantially thicker than the dimensions of particles or additives, resulting in those additives being entrapped within the coating, thereby limiting their efficacy.

Accordingly, there is a need in the art for efficient methods of incorporating additives into polymers and polymer composite materials such as glass or fiber filled polymers so as to expose the additives at the polymer's surface but while also minimizing the amount of additives used. There is also a related need for methods for incorporating additives into the surfaces of coatings.

SUMMARY

The present invention is not only an improvement over these existing methods, but is directly compatible with existing molding and coatings processes. Resin beads, pellets, nurdles, and the like used in plastic product production and masterbatch applications can be treated with the inventive process described herein. Additives and other particles can be directly embedded into the resin beads, pellets, and/or nurdles and subsequently products could be formed from these beads/pellets as usual, but with the additives or particles spread throughout the product. Similarly, the present invention is applicable to polymeric coatings since particles can be directly embedded into these coatings to extend further additive functionalities to the surface coating.

In a first embodiment, the present invention provides methods for producing an article, comprising applying, to at least a portion of a molding form, a fluid comprising a population of particles that includes at least one particle having a characteristic dimension in the range of from about 0.1 nm to about 100 microns; and molding a working composition using the treated molding form so as to give rise to at least one particle being at least partially or securely embedded in the working composition.

In a second aspect, the present invention provides methods of modifying a coating material, comprising applying a fluid comprising a plurality of particles having a cross-sectional dimension in the range of from about 0.1 nanometers to about 100 microns to a wet coating material disposed on a substrate; and drying the wet coating material so as to give rise a coated article wherein at least one of the particles being at least partially embedded in the surface of the dried coating. The term wet coating does not require that the coating be aqueous-based or even be a free-flowing fluid; wet may also refer to a solvent based coating or any coating that has a liquid phase, is at least partially liquid, or has properties resembling those of a liquid. The term refers to a coating that is not yet completely dried, cured, or otherwise in final form.

BRIEF DESCRIPTION OF THE DRAWINGS

FIG. 15 is a non-limiting depiction of the claimed coating enhancement processes.

DETAILED DESCRIPTION OF ILLUSTRATIVE EMBODIMENTS

Molding

In a first embodiment, the present invention provides methods for producing an article, comprising applying, to at least a portion of a molding form, a fluid comprising population of particles that includes at least one particle having a characteristic dimension in the range of from about 0.1 nm to about 100 microns; and molding a working composition using the treated molding form so as to give rise to at least one particle being at least partially or securely embedded in the working composition.

The population of particles is suitably disposed or even suspended in the fluid by mixing, sonicating, shaking, vibrating, flowing, stirring, agitating, and the like. The fluid may be viscous, and the fluid's viscosity may be modified as needed by the user to optimize the application of the particle-bearing fluid to the substrate. As one example, the fluid may so viscous that the particles remain in position when the fluid is applied to the interior of the molding form. Alternatively, the particles may be maintained in position on the molding form by magnetic or electric fields, as set forth elsewhere herein.

Figure 14:
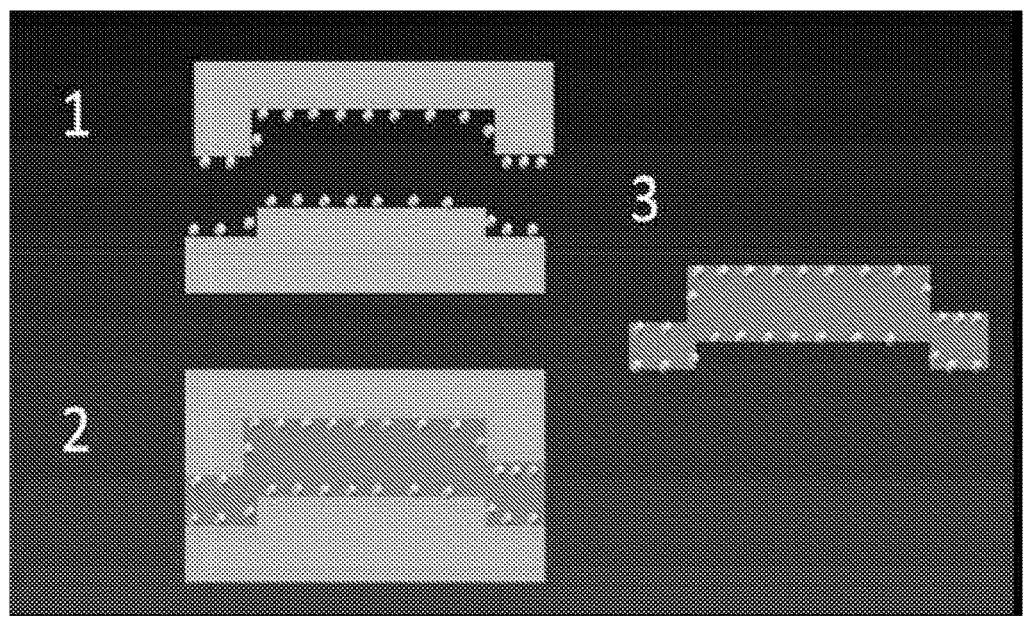
FIG. 14 is a non-limiting depiction of the claimed molding processes.

A non-limiting depiction of the process is shown in FIG. 14. As shown in that figure, (1) particles are disposed onto the surface of a mold. As mentioned, the particles may be disposed in a fluid. At step (2) the molding composition is introduced to the particle-bearing mold, and at least a portion of the particles are at least partially embedded into the molding composition. The molding composition is then (3) removed from the mold as a finished article, which article has particles at least partially embedded therein. The mold may be of virtually any shape, and the relative sizes of the particles and mold in this figure are illustrative only and do not limit the scope of the claimed invention.

The molding form may be essentially any molding form used in the field. The molding form and fluid are suitably chosen such that the fluid and molding form do not adversely interact with one another, and the fluid is thus suitably chosen such that it is inert to the molding form. In some embodiments, as described elsewhere herein, the fluid is inert to the particles.

Fluids may be, inter alia, liquids, gases, or even supercritical fluids. Combination fluids are also suitable. Fluids may include one or more solvents. The fluid may also include water, ions, a non-polar solvent, an organic solvent, a polar solvent, an aprotic solvent, a protic solvent, an inorganic solvent, and the like. Oils are also considered suitable fluids. Salts, surfactants, dispersants, stabilizers, or binders may also be included in the fluids.

A non-exclusive listing of suitable fluids include 2-methyltetrahydrofuran, a chloro-hydrocarbon, a fluoro-hydrocarbon, a ketone, a paraffin, acetaldehyde, acetic acid, acetic anhydride, acetone, acetonitrile, an alkyne, an olefin, aniline, benzene, benzonitrile, benzyl alcohol, benzyl ether, butanol, butanone, butyl acetate, butyl ether, butyl formate, butyraldehyde, butyric acid, butyronitrile, carbon disulfide, carbon tetrachloride, chlorobenzene, chlorobutane, chloroform, cycloaliphatic hydrocarbons, cyclohexane, cyclohexanol, cyclohexanone, cyclopentanone, cyclopentyl methyl ether, diacetone alcohol, dichloroethane, dichloromethane, diethyl carbonate, diethyl ether, diethylene glycol, diglyme, di-isopropylamine, dimethoxyethane, dimethyl formamide, dimethyl sulfoxide, dimethylamine, dimethylbutane, dimethylether, dimethylformamide, dimethylpentane, dimethylsulfoxide, dioxane, dodecafluoro-1-hepatanol, ethanol, ethyl acetate, ethyl ether, ethyl formate, ethyl propionate, ethylene dichloride, ethylene glycol, formamide, formic acid, glycerine, heptane, hexafluoroisopropanol, hexamethylphosphoramide, hexamethylphosphorous triamide, hexane, hexanone, hydrogen peroxide, hypochlorite, i-butyl acetate, i-butyl alcohol, i-butyl formate, i-butylamine, i-octane, i-propyl acetate, i-propyl ether, isopropanol, isopropylamine, ketone peroxide, methanol and calcium chloride solution, methanol, methoxyethanol, methyl acetate, methyl ethyl ketone (MEK), methyl formate, methyl n-butyrate, methyl n-propyl ketone, methyl t-butyl ether, methylene chloride, methylene, methylhexane, methylpentane, mineral oil, m-xylene, n-butanol, n-decane, n-hexane, nitrobenzene, nitroethane, nitromethane, nitropropane, 2-, N-methyl-2-pyrrolidinone, n-propanol, octafluoro-1-pentanol, octane, pentane, pentanone, petroleum ether, phenol, propanol, propionaldehyde, propionic acid, propionitrile, propyl acetate, propyl ether, propyl formate, propylamine, p-xylene, pyridine, pyrrolidine, sodium hydroxide, sodium, t-butanol, t-butyl alcohol, t-butyl methyl ether, tetrachloroethane, tetrafluoropropanol, tetrahydrofuran, tetrahydronaphthalene, toluene, triethyl amine, trifluoroacetic acid, trifluoroethanol, trifluoropropanol, trimethylbutane, trimethylhexane, trimethylpentane, valeronitrile, water, xylene, xylenol, or any combination thereof.

Suitable inorganic solvents include, e.g., ammonia, sulfur dioxide, sulfuryl chloride, sulfuryl chloride fluoride, phosphoryl chloride, phosphorus tribromide, dinitrogen tetroxide, antimony trichloride, bromine pentafluoride, hydrogen fluoride, and the like.

Ionic solutions include choline chloride, urea, malonic acid, phenol, glycerol, 1-alkyl-3-methylimidazolium, 1-alkylpyridinium, N-methyl-N-alkylpyrrolidinium, 1-Butyl-3-methylimidazolium hexafluorophosphate, ammonium, choline, imidazolium, phosphonium, pyrazolium, pyridinium, pyrrolidnium, sulfonium, 1-ethyl-1-methylpiperidinium methyl carbonate, and 4-ethyl-4-methylmorpholinium methyl carbonate. Other methylimidazolium solutions are considered suitable, including 1-Ethyl-3-methylimidazolium acetate, 1-butyl-3-methylimidazolium tetrafluoroborate, 1-n-butyl-3-methylimidazolium tetrafluoroborate, 1-butyl-3-methylimidazolium hexafluorophosphate, 1-n-butyl-3-methylimidazolium hex afluorophosphate, 1-butyl-3-methylimidazolium 1,1,1-trifluoro-N-[(trifluoromethyl)sulfonyl]methanesulfonamide, 1-butyl-3-methylimidazolium bis(trifluoromethylsulfonyl)imide, 1-butyl-3-methylimidazolium bis[(trifluoromethyl)sulfonyl]amide, and 1-butyl-3-methylimidazolium bis[(trifluoromethyl)sulfonyl]imide, and the like.

Fluids suitable for the claimed methods also include, e.g., N-ethyl-N,N-bis(1-methylethyl)-1-heptanaminium bis[(trifluoromethyl)sulfonyl]imide, ethylheptyl-di-(1-methylethyl) ammonium 1,1,1-trifluoro-N-[(trifluoromethyl)sulfonyl] methanesulfonamide, ethylheptyl-di-(1-methylethyl) ammonium bis(trifluoromethylsulfonyl)imide, ethylheptyl-di-(1-methylethyl)ammonium bis[(trifluoromethyl) sulfonyl]amide, and the like. The fluid may also include ethylheptyl-di-(1-methylethyl)ammonium bis[(trifluoromethyl)sulfonyl]imide, N,N,N-tributyl-1-octanaminium trifluoromethanesulfonate; tributyloctylammonium triflate, tributyloctylammonium trifluoromethanesulfonate, N,N,N-tributyl-1-hexanaminium bis[(trifluoromethyl)sulfonyl] imide, tributylhexylammonium 1,1,1-trifluoro-N-[(trifluoromethyl)sulfonyl]methanesulfonamide, tributylhexylammonium bis(trifluoromethylsulfonyl)imide, tributylhexylammonium bis[(trifluoromethyl)sulfonyl] amide, tributylhexylammonium bis[(trifluoromethyl)sulfonyl]imide, N,N,N-tributyl-1-heptanaminium bis[(trifluoromethyl)sulfonyl]imide, tributylheptylammonium 1,1,1-trifluoro-N-[(trifluoromethyl)sulfonyl]methanesulfonamide, tributylheptylammonium bis(trifluoromethylsulfonyl)imide; tributylheptylammonium bis[(trifluoromethyl)sulfonyl]amide, tributylheptylammonium bis[(trifluoromethyl)sulfonyl] imide, N,N,N-tributyl-1-octanaminium bis[(trifluoromethyl)sulfonyl]imide, tributyloctylammonium 1,1,1-trifluoro-N-[(trifluoromethyl)sulfonyl]methanesulfonamide, tributyloctylammonium bis(trifluoromethylsulfonyl)imide, tributyloctylammonium bis[(trifluoromethyl)sulfonyl] amide, tributyloctylammonium bis[(trifluoromethyl)sulfonyl]imide, 1-butyl-3-methylimidazolium trifluoroacetate, 1-methyl-1-propylpyrrolidinium 1,1,1-trifluoro-N-[(trifluoromethyl)sulfonyl]methanesulfonamide, 1-methyl-1-propylpyrrolidinium bis(trifluoromethylsulfonyl)imide, 1-methyl-1-propylpyrrolidinium bis[(trifluoromethyl)sulfonyl]amide, 1-methyl-1-propylpyrrolidinium bis[(trifluoromethyl)sulfonyl]imide, 1-butyl-1-methylpyrrolidinium 1,1,1-trifluoro-N-[(trifluoromethyl)sulfonyl]methanesulfonamide, 1-butyl-1-methylpyrrolidinium bis(trifluoromethylsulfonyl)imide, 1-butyl-1-methylpyrrolidinium bis[(trifluoromethyl)sulfonyl]amide, 1-butyl-1-methylpyrrolidinium bis[(trifluoromethyl)sulfonyl]imide, 1-butylpyridinium 1,1,1-trifluoro-N-[(trifluoromethyl)sulfonyl]methanesulfonamide, 1-butylpyridinium bis(trifluoromethylsulfonyl)imide, 1-butylpyridinium bis[(trifluoromethyl)sulfonyl]amide, 1-butylpyridinium bis[(trifluoromethyl)sulfonyl]imide, 1-butyl-3-methylimidazolium bis(perfluoroethylsulfonyl)imide, butyltrimethylammonium bis(trifluoromethylsulfonyl) imide, 1-octyl-3-methylimidazolium 1,1,1-trifluoro-N-[(trifluoromethyl)sulfonyl]methanesulfonamide, 1-octyl-3-methylimidazolium bis(trifluoromethylsulfonyl)imide, 1-octyl-3-methylimidazolium bis[(trifluoromethyl)sulfonyl] amide, 1-octyl-3-methylimidazolium bis[(trifluoromethyl) sulfonyl]imide, 1-ethyl-3-methylimidazolium tetrafluoroborate, N,N,N-trimethyl-1-hexanaminium bis [(trifluoromethyl)sulfonyl]imide; hexyltrimethylammonium 1,1,1-trifluoro-N-[(trifluoromethyl)sulfonyl]methanesulfonamide, hexyltrimethylammonium bis(trifluoromethylsulfonyl)imide, hexyltrimethylammonium bis[(trifluoromethyl) sulfonyl]amide, hexyltrimethylammonium bis [(trifluoromethyl)sulfonyl]imide, N,N,N-trimethyl-1-heptanaminium bis[(trifluoromethyl)sulfonyl]imide, heptyltrimethylammonium 1,1,1-trifluoro-N-[(trifluoromethyl)sulfonyl]methanesulfonamide, heptyltrimethylammonium bis(trifluoromethylsulfonyl)imide, heptyltrimethylammonium bis[(trifluoromethyl)sulfonyl]amide, heptyltrimethylammonium bis[(trifluoromethyl)sulfonyl] imide, N,N,N-trimethyl-1-octanaminium bis[(trifluoromethyl)sulfonyl]imide, trimethyloctylammonium 1,1,1-trifluoro-N-[(trifluoromethyl)sulfonyl]methanesulfonamide, trimethyloctylammonium bis(trifluoromethylsulfonyl) imide, trimethyloctylammonium bis[(trifluoromethyl)sulfonyl]amide, trimethyloctylammonium bis[(trifluoromethyl) sulfonyl]imide, 1-ethyl-3-methylimidazolium ethyl sulfate, and the like. As will be apparent to the user of ordinary skill in the art, a wide variety of fluids may be used in the claimed invention.

In some embodiments, the fluids include a volatile component. The volatile component is used where the user may desire to remove some or all of the fluid before or during the molding process. The fluid may be removed by heating, flash-heating, distillation, evaporation, suction, vacuum, and the like. It is not, however, necessary that the fluid be removed (in whole or in part) before, during, or after the molding process. Such methods may remove non-volatile components as well.

The fluid may suitably be one that evaporates at ambient conditions. After molding the working composition using the treated molding form, the article would then contain a plurality of the particles embedded into its surfaces.

In some embodiments, the fluid is suitably substantially inert to the population of particles. The fluid is also suitably essentially inert to the molding form.

In some embodiments, the fluid includes at least one agent capable of at least partially inhibiting inter-particle agglomeration. The particles may themselves be inherently dispersable in the fluid, and the particles are suitably uniformly dispersed within the fluid. In some embodiments, two or more particles are characterized as agglomerated or aggregated with one another.

The fluid may be applied to the molding form in a variety of ways. These application methods include spraying, electrostatic spraying, spin casting, dipping, painting, dripping, brushing, immersing, flowing, exposing, electrostatic spraying, pouring, rolling, curtaining, wiping, printing, pipetting, ink jet printing, and the like. Spraying is considered especially suitable, though printing-based methods are considered suitable for embodiments where the user may desire to apply the particle-bearing fluid to only a portion of the molding form.

The fluid may be combined with a variety of additives or enhancers. A non-exclusive listing of such materials includes surfactants, dispersants, wetting agents, or thickening agents, such including: agar-agar, methyl cellulose, polysilicic acid, sodium dialkylsulfosuccinates, alginate, silica, zeolite, dioctyl sulfosuccinate sodium salt, AOT, SDS sodium butyl sulfate, SOS, SBS, Triton X-100, xanthum gum, lecithin, alginin, guar gum, locust bean gum, other gums, polyethylene glycol, other glycols, calcium carbonate, polyacrylic acid, Alkyl poly(ethylene oxide), alkylphenol poly(ethylene oxide), copolymers of poly(ethylene oxide) and polypropylene oxide), oleic acid, PVP, calcium chloride, silica, anionic surfactants, cationic surfactants, zitterionic surfactants, cocamides, dodecyl dimethylamine oxide, polysorbates, other surfactants, non-ionic surfactants, fatty alcohols, polyglucosides, and the like. Such materials may be used to, e.g., alter the mechanical properties (e.g., viscosity) of the fluid.

Particles may be affixed against the molding form so as to maintain their position during introduction of the molding composition. This may be accomplished by affixing at least a portion of the particles against the molding form by applying an electric, magnetic, chemical, or pressure gradient, or by other methods. The gradient may be removed or turned off following inclusion of the particles into the molding compound. The user may also apply the gradient to adjust the embedding of one or more particles within the molding composition. For example, the user may apply a gradient to drive particles more deeply into the molding composition or, in the alternative, to partially withdraw particles from the composition.

In some embodiments, the fluid is stationary relative to the molding form. In others, at least one of the molding form and fluid moves relative to the other. This is exemplified in embodiments where the user applies the fluid to the molding form by a curtaining process, wherein the molding form is moved through a curtain of fluid.

The term "cross-sectional" dimension as used herein may refer to the diameter, length, width, or height of a particle. The population of particles suitably includes an average cross sectional dimension in the range of from about 0.1 nm to about 100 microns. In some embodiments, the average cross-sectional dimension is in the range of from about 1 nm to about nm to about 5 microns, or from about 100 nm to about 1 micron, or even from about 200 nm to about 200 nm. In some embodiments, substantially all the particles have a cross-sectional dimension in the range of from about 0.1 nm to about 100 microns.

The population of particles may include a homogeneous population of particles. In other embodiments, the population is heterogeneous, and may include particles of different sizes, different materials, or both. In this way, the user may embed multiple kinds of particles with multiple kinds of functionalities.

The particles are suitably spherical in shape, but may also be cylindrical, tubular, cubic, spheroidal, pyramidal, amorphous, crystalline, tetragonal, hexagonal, trigonal, orthorhombic, monoclinic, oblong, or even triclinic in form. The optimal shape of particles being used in a particular application will be easily determined by the user of ordinary skill.

Particles may also suitably include one or more functional agents or molecules. Such agents and molecules are useful in conferring additional, useful properties on the particles.

As one non-limiting example, a particle may include an antimicrobial agent, which in turns gives rise to a final, molded article that itself has antimicrobial properties. Functional agents may also include biocides, insulators, conductors, semiconductors, catalysts, fluorescent agents, flavors, ligands, receptors, antibodies, antigens, labels, lubricants, fragrances, absorbers, adsorbers, flame retardants, and the like. The particles themselves may inherently possess one or more of these properties without the inclusion of additional agents.

Functional agents may include, for example, an antimicrobial agent, a biocidal agent, an insulator, a conductor, a semiconductor, a catalyst, a fluorescent agent, a flavor agent, a catalytic agent, a biomolecule binding agent, a chemical binding agent, a label, a lubricant, a fragrance, an absorber of or chemicals, biomolecules, or electromagnetic radiation, an adsorber of chemicals, biomolecules, or electromagnetic radiation, a scatterer of electromagnetic radiation, a fire-retarder, a capsule, an encapsulant, a color or cosmetic effect, a radiopaque agent, a radioactive agent, or any combination thereof. As will be apparent to the user of ordinary skill in the art, a particle may include one, two, or more functional agents.

Exemplary particle materials include silver, silver oxide, ZnO, TiO2, zinc pyrithione, chlorhexidine, iodophor, triclosan, nisin, lactoferrin, sodium diacetate, sorbic acid, potassium sorbate, OBPA (10,10'-oxybisphenoxarsine), amine-neutralized phosphate, zinc-OMADINE (zinc 2-pyridinethianol-1-oxide), 2-n-octyl-4-isothiazolin-3-one, DCOIT, CAPTAN, FOLPET, triclosan, pyrithiones including copper pyrithione and zinc pyrithione, copper pyrithone, copper, copper oxide, silver glass, copper glass, zinc glass, silver zeolite, copper zeolite, zinc zeolite, silver sodium hydrogen zirconium phosphate, silver, copper or zinc including their oxides in nanoparticle, microparticle form, ion exchange particles, quaternary ammonium compounds and salts, or any combination thereof.

In some embodiments, the particles are multichromic. This enables the production of articles that exhibit a color change when exposed to particular physical quantities, such as electric fields, magnetic fields, radiation, energy, temperature change, chemicals, stress, or biological substances. Suitably multichromic materials are described elsewhere herein.

Particles may also include, inter alia, materials that reflect, absorb, or scatter electromagnetic radiation, such as infrared radiation, ultraviolet radiation, and/or x-ray radiation. Such materials include, e.g., Ge, $TiO_2$, Si, $Al_2O_3$, $CaF_2$, ZnS, GaAs, ZnSe, KCl, indium tin oxide, tin oxide, $TiO_2$, ZnO, MgO, $CaCO_3$, benzophenones, benzotriazole, hindered amine light stabilizers, cyanoacrylate, salicyl-type compounds, nickel, Pb, Pd, Bi, Au, Ba, $BaSO_4$, steel, U, Hg, and the like.

Particles may also include one or more electronically conductive materials. Such materials include carbon nanotube, a metal, a nanowire, polyacetylene, polyaniline, polyarylene, polythiophene, graphene, pentacene, poly(phenylene ethynylene) (PPE), poly(phenylene vinylene) (PPV), poly(3,4-ethylenedioxythiophene) (PEDOT), poly(styrenesulfonate) (PSS), poly(3-hexylthiophene) (P3HT), poly(3-octylthiophene) (P3OT), poly(arylene ether sulphone), poly(C-61-butyric acid-methyl ester) (PCBM), poly[2-methoxy-5-(2'-ethyl-hexyloxy)-1,4-phenylene vinylene] (MEH-PPV), or any combination thereof. Semiconducting materials are also suitable for the particles of the claimed invention. Suitable semiconducting materials include, inter alia, C (diamond), C (graphene), Ge, Si, AlAs, AN, AlP, AlSb, Bas, BN, BP, CdS, CdSe, CdTe, Cu2O, Cu2S, CuCl, CuOGaAs, GaAs, GaN, GaP, GaSb, InAs, InN, InP, InSb, PbS, PbSe, PbTe, PtSi, SiC, SiGe, SnS, SnTe, TiO2, ZnO, ZnS, ZnSe, ZnTe, AlGaAs, AlGaN, AlInAs, AlInSb, CIS, CdZnTe, GaAsN, GaAsP, HgCdTe, HgZnSe, HgZnTe, InAsSb, InGaAs, InGaN, InGaP, InGaSb, PbSnTe, CuInGaSe (CIGS), carbon nanotubes, quantum heterostructures, and the like.

The particles may be embedded into the final article to varying degrees. In some embodiments, the particles are, on average, suitably embedded to the extent of more than 100% of a characteristic dimension. The particles may also, on average, be embedded to the extent of not more than about 100% of a characteristic dimension. In certain embodiments, the particles are embedded such that the particle is essentially entirely within the molded article.

The particles may also, on average, be embedded to the extent of not more than about 80% of a characteristic dimension, not more than about 50% of a characteristic dimension, or not more than about 25% of a characteristic dimension. The degree of embedding will depend on the process conditions and the surface topography of the molding form.

Particles may extend, on average, out from the surface of the substrate from about 0.1 nm to about 1 cm, or from about 10 nm to about 0.5 cm, or from about 100 nm to about 100 microns. The claimed methods can be used to produce articles where not all the same particles are embedded to the same degree or where not all particles extend equally outward from the article.

In some embodiments, essentially all of the surface area of the working composition is occupied by particles. In other, suitable embodiments, less than about 75% of the surface area of the working composition is occupied by particles, less than about 50% of the surface area, less than about 25% of the surface area, or even less than about 10% or even about 5% of the surface area of the working composition is occupied by particles. The degree of coverage may be dictated by the needs of the user; in some situations, the user may not require more than a small portion of the surface area to be occupied by particles.

Process conditions may be adjusted such that neighboring particles are separated from one another, on average, by from about 0.1 nm to about 100 microns, or from about 1 nm to about 10 microns. Neighboring particles may suitably be separated by from about 10 nm to about 1 micron, or from about 50 nm to about 0.5 microns, or from 100 nm to about 1000 nm. Particles may, in some embodiments, be embedded in agglomerated form. Particles may, in some embodiments, be in physical or electronic contact with neighboring particles.

The particles may be embedded into a particular or discrete region of the final article, or may be disposed across the entire surface of the article, suitably in an even fashion. The particles may be suitably harder than the molding composition in the article, although in some embodiments, the molding composition in the article is harder than the particles.

The final article may be flat, cylindrical, polyhedral, spherical, grooved, curved, arced, pitted, hollowed, or have irregular shape depending on the molding form and on any post-processing steps that entail further shaping the molding composition after molding.

A final article according to the present invention may be used as purifier, a sanitizer, a biocide, a detector, a sensor, a labeler, a tagger, a treatment system, an electronic component, an optical component, a catalyst, and the like. The final articles are also useful as conducting components, a semiconducting components, support structures, catalysts, adsorbers for chemicals, biomolecules, or electromagnetic radiation, absorbers for chemicals, biomolecules, or electromagnetic radiation, a binder for chemicals or biomolecules, an optical component, an insulating component, a binder, a scattering component, a piezochromic, chemichromic, photochromic, magnetochromic, thermochromic, stress chromic, or other multichromic component or device. Membranes are considered especially suitable final articles.

The molding is suitably accomplished by processes known in the art. A non-exclusive listing of such processes includes compaction plus sintering, injection molding, reaction injection molding, compression molding, transfer molding, ram molding, extrusion molding, rotational molding, thermoforming, vacuum forming, laminating, expandable bead molding, foam molding, rotomolding, vacuum plug assisted molding, pressure plug assisted molding, matched molding, stamping, press molding, extrusion, blow molding, rolling, and the like. Injection molding and rolling are considered particularly suitable methods.

Polymers are particularly suitable working compositions for the present methods. Suitable polymers comprise, inter alia, organic polymers, inorganic polymers, synthetic polymers, natural polymers, thermoplastics, thermosets, copolymers, biopolymers, fluoropolymers, silicones, silicone rubbers, vinyls, elastomers, waxes, polyolefins, liquid crystal polymers, ionomers, and include but are not limited to:

a plastarch material, a plastisol, a polyacetal, acrylonitrile butadiene styrene (ABS), an organosol, acrylics, aramid, aromatic polyamide, bakelite, bismaleimide, borazine, cellulosics, copolyesters, copper phthalocyanine, decamethylcyclopentasiloxane, dodecamethylcyclohexasiloxane, decamethyltetrasiloxane, epoxy, ethylene methyl acrylate (EMA), ethylene vinyl acetate (EVA), ethylene vinyl alcohol (EVOH), fluorinated ethylene-propylene (FEP), fluoropolymer, hexamethylcyclotrisiloxane, hexamethyldisiloxane, HDPE, LDPE, melamine formaldehyde (MF), melamine, Nafion, nitrile, novotext, Nylon, Nylon 6, Nylon 66, Nylon 11, Nylon 12, Nylon 610, Nylon 612, octamethylcyclotetrasiloxane, octamethyltrisiloxane, perfluoroalkoxy polymer resin (PFA), perfluorosulfonic acid, phenolics (PF), phenoxy, phenylene ether/oxide, poly paraphenylene terephthalamide, poly(methyl methacrylate) (PMMA), poly (N-vinyl pyrrolidone), poly(propylene fumarate), cellophanepoly(vinylidene fluoride-trifluoroethylene), polyacrylamide, polyacrylonitrile butadiene styrene (ABS), polyallyl phthalate, polyamide (PA), polyanhydrides, polyamideimide, polyarylate, polyarylether, polyarylsulfone, polybenzimidazolepolybutylene (PB), polybutylene terephthalate (PBT), polybutylene, polycaprolactone, polycarbonate (PC), polychlorotrifluoroethylene (PCTFE) perfluoropolyether (PFPE), polydimethylsiloxane (PDMS), polyepoxide, polyester (PEs), polyetheretherketone (PEEK), polyetherimide (PEI), polyetherimide, polyethersulphone (PES), polyethylene (PE), polyethylene terephthalate (PET), polyethylenetetrafluoroethylene (ETFE), polyethyleneoxide, polyglycolic acid (PGA), polyglycolide, polyimide, polyisobutene, polyisoprene, polyketone, polylactic acid (PLA), polylactic acid, polyllyl diglycol carbonate monomer, polymethyl pentene (PMP), polymethylpentene, polyolefins, polyoxymethylene (POM), polyphenyl ether (PPE), polyphenylene vinylene, polyphenylene, polypropylene (PP), polypropylene, polystyrene (PS), polystyrene, polysulfide, polysulfone (PES), polysulphone (PSU), polytetrafluoroethylene (PTFE), polyurethane (PU), polyvinyl, polyvinyl carbazole, polyvinyl chloride (PVC), polyvinyl fluoride (PVF), polyvinyl pyridine, polyvinylidene chloride (PVDC), polyvinylidene fluoride (PVDF), richlite, silane, silicone, siloxane, styrenes, styrene maleic anhydride, styrene-acrylonitrile (SAN), styrene-isoprene-styrene (SIS), sytrene maleic anhydride (SMA), Teflon®, tetrafluoroethylene-perfluoro-3,6-dioxa-4-methyl-7-octenesulfonic acid copolymer, TPU, trifluoroethylene, Tritan®, Tuihol, urea, urea-formaldehyde (UF), vinylidene fluoride, and the like.

Biopolymers are also suitable for the claimed invention, and include bamboo, bio-derived polyethylene, burlap, canvas, carbodiimide, cartilage, cellophane, celluloid, cellulose acetate (CA), cellulose acetate butyrate (CAB), cellulose nitrate, cellulose propionate (CP), cellulose, celluose acetate propionate (CAP), chitin, chitosan, coir, collagen, connective tissue, copper phthalocyanine, cotton cellulose, cuprammonium, elastin, epithelium, feathers, fibrin, fingernails, flax, fur, glycosaminoglycans, ground tissue, hair, hemp, jute, kenaf, keratin, leather, linen, linen, lyaluronic acid, muscle tissue, nervous tissue, nitrocellulose, osseous tissue, paper, papyrus, parchment, periosteum, plastarch, poly(propylene fumarate), poly(vinylidene fluoride-trifluoroethylene), poly-3-hydroxybutyrate polyesters, polyamide, polycaprolactone, polyglycolic acid (PGA), polyglycolide, polylactic acid (PLA), polylactide acid plastics, polyphenylene vinylene, raffia, rayon, rice, silk, sisal, starch, starch-based plastics, toenails, vascular tissue, vinylidene fluoride, viscose, wood, wool, or any monomer, copolymer, combination, or composite thereof. The working composition may include monomers as well, which monomers are later polymerized and even cross-linked.

Minerals, metals, and alloys can also be included in the working composition. The working composition can include alloys and composite materials, as well.

In one particular, non-limiting embodiment, the molding form comprises a roller. In such embodiments, the methods entail contacting the roller against the polymeric composition such that at least a portion of the particles are at least partially embedded in the substrate. The pressure of the roller can be modulated so as to control, to at least some extent, the degree to which particles are embedded in the molding compositions. By using a roller, the user may execute the disclosed methods in a continuous manner.

In some embodiments, the molding composition has other structures or particles disposed within it before embedding of particles according to the disclosed invention. For example, the molding composition may include wires or other structures within. In such an embodiment, embedding metallic particles can place the wires within the molding composition into electronic communication with the environment exterior to the final article.

The particles may be uniformly (or non-uniformly, in specific patterns) disposed across the interior of a mold (compression, ram mold, injection mold, press mold, stamping, or any other mold device), using electric, static, and/or magnetic charge to cause the particles to preferentially stick to the mold. Chemical gradients may also be used to affix or stick particles to the molding form.

Some embodiments suitably include applying an electric charge to the mold such that at least a portion of the particles are affixed against the molding form. The user may electrically ground the mold and apply an electric charge to the particles such that at least a portion of the particles are affixed against the molding form. In other embodiments, the user may selecting magnetic particles and a suitable molding form material to which the particles are magnetically attracted such that at least a portion of the particles are affixed against the molding form.

As one non-limiting example, the user may use a magnetic field to hold in place metallic or other magnetic particles so as to localize those particles to a particular region of the mold. By localizing multiple particle populations, the user may then produce an article having two or more regions having different functionalities.

The user then suitably molds a material (polymer, glass, metal, metalloid, or other material, or any combination of these). The mold may take any shape, whether it is designed to output a simple sheet-like product or a 3-D shape with simple or complex features. Molds are well-known in the art, and the optimal mold for a particular application will be easily identified by the user of ordinary skill in the art.

The pressure and/or the temperature of the molding process embed the particles into the surface of the product if the conditions (particle composition, particle structure, particle size, temperature, pressure, molded material composition, and other conditions) are selected such that the particles do not fuse and form a single layer on top of the product, but instead remain as discrete yet embedded particles or discrete embedded multi-particle-aggregates.

In other embodiments, the particles and processing conditions are chosen such that the particles fuse or otherwise combine to form a network, a shell, or other cohesive structure that covers at least part of the final article. In some cases, the particles and conditions are chosen such that the particles have a lower melting point than does the polymer into which the particles are embedded. In this way, the final article can be heated to the particles' melting temperature so as to give rise to a shell or network of melted particles around the exterior of the final, molded article.

A solution that contains particles suspended therein via stabilization, agitation, or both, may also be used. Solutions that include a suspension of particles are considered suitable for the present invention. Alcohols and water are considered particularly suitable fluids.

Carrier solutions may or may not be inert to the molding material or the particles. This solution-based system may then be used to spray, roll-on, or otherwise coat the mold interior. In some embodiments, the solution is evaporate before molding, during molding, or after molding, or may even be burned off during molding. Volatile solutions, such as alcohols, ethers, and the like, are considered useful where the user desires to apply the particles to the mold without also having the solution be present during the molding process. In some embodiments, the carrier solution, the particles, or both, are adhesive or tacky, thus enabling the user to control the location of the particles on the surface of the mold. The tackiness of the solutions/particles is suitably chosen such that once the particles are embedded in the molding compound, they are more fastened securely enough to the molding compound than they are to the mold.

The disclosed methods may be executed as a batch process, such as injection molding, stamping, and the like. In some embodiments, the methods are executed as a continuous process, which can be achieved through the use of a cylindrical roller or other continuously moving body. The roller need not, however, be round, and can have indentations or other patterns disposed thereon.

In such embodiments, particles are continuously deposited on one or more portions of the roller prior to that portion of the roller being placed into contact with the substrate (e.g., polymer, metal, glass, metalloid, and the like).

The substrate for roller-based processes is suitably a flat surface (e.g., a film, plate), although tiles, boards, ingots, bricks, membranes, and the like are also suitable for the continuous process embodiments described herein.

As above, the particles may be induced to deposit on the roller using electric, static, and/or magnetic charge, or even through the use of a solution that may or may not be inert to the substrate. Pressure and/or temperature may optionally be adjusted to control the degree of embedding. The particles may also be made to deposit on the substrate using similar processes as described above, prior to the roller contacting the surface, providing an alternate means of embedding.

These processes may impart the same benefits (e.g., altered optical, physical properties, antimicrobial properties, electronic properties) described elsewhere in this filing as well as previously referenced inventions and may therefore be used to produce devices mentioned as well. A variety of application to which the claimed processes are suitable is presented below.

Figure 1:
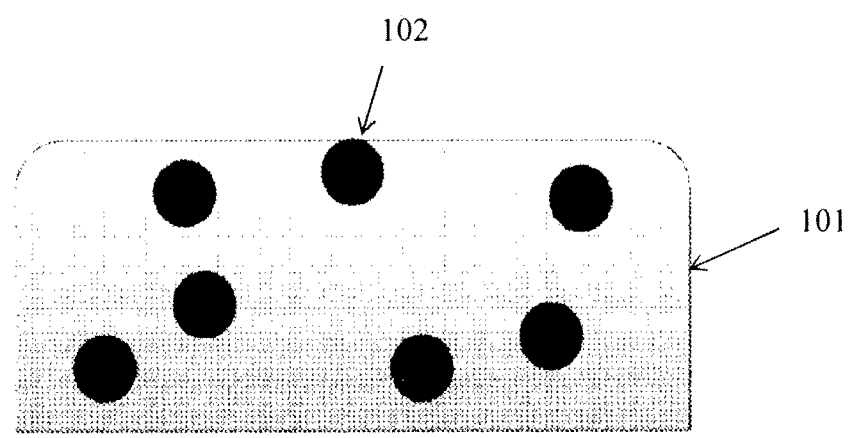
FIG. 1 depicts a schematic cross-sectional view of additive particles that are bulk-dispersed, or directly incorporated, within a material.
Figure 2:
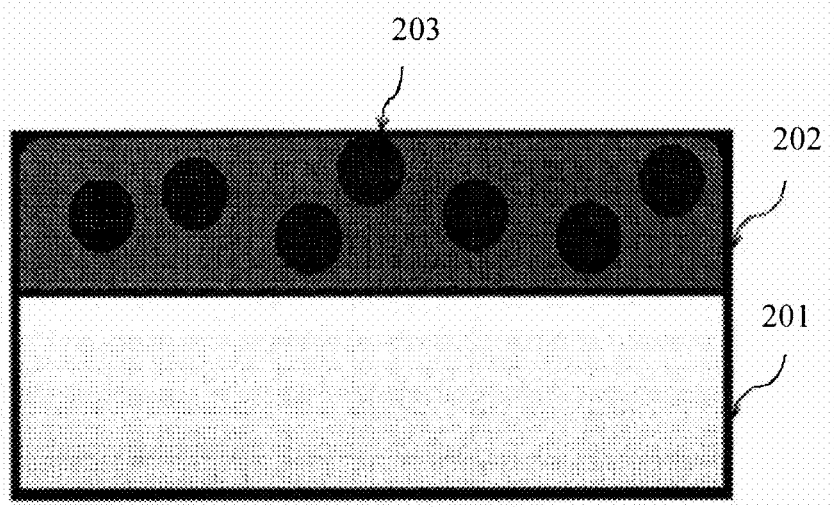
FIG. 2 depicts a schematic cross-sectional view of additive particles that have been applied to one side of a substrate by a traditional coating method.
Figure 3:
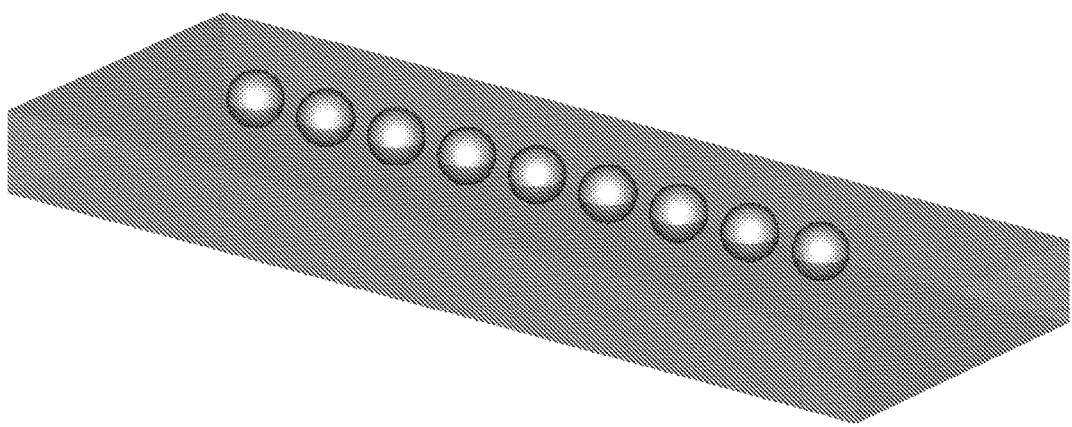
FIG. 3 depicts a 3-dimensional view of a slab of plastic partially embedded with a linear array of silver nanoparticles.
Figure 4:
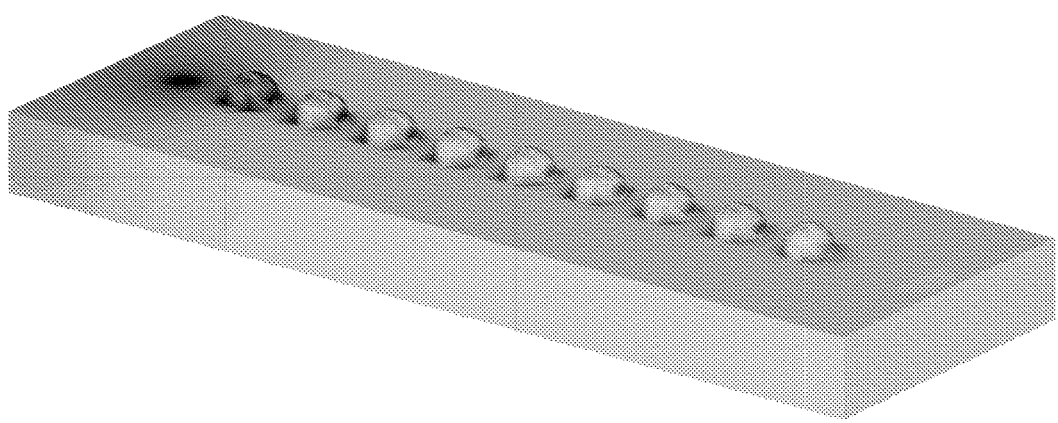
FIG. 4 illustrates the calculated electric field energy density distribution of the metal nanoparticle plasmon waveguide described in FIG. 3. The wave plasmon wave is excited by a short dipole source, which can be a fluorescent molecule, a near-field scanning optical microscope illumination tip, or a quantum dot.
Figure 5:
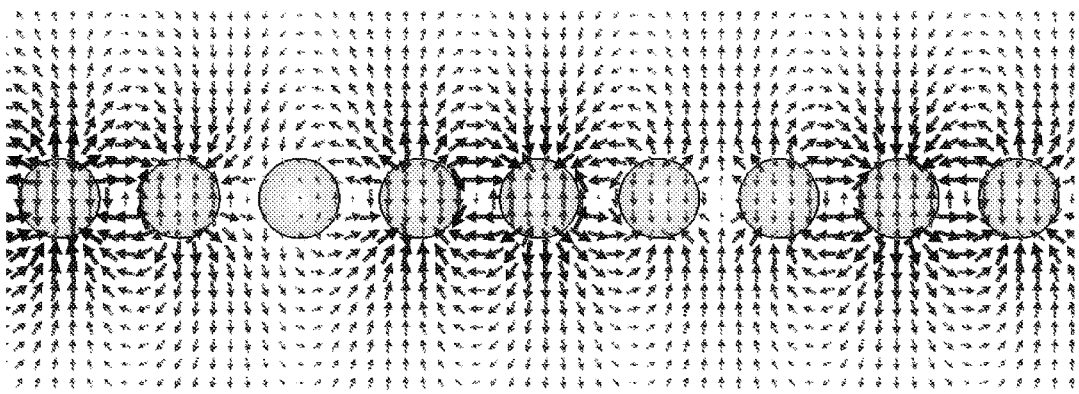
FIG. 5 illustrates the calculated instantaneous electric field vectors along the metal nanoparticle plasmon waveguide composed of an array of silver nanoparticles embedded in Teflon described in FIG. 3. The wave propagates towards the right, undergoing extinction from plasmonic collision and radiatively losses.
Figure 6:
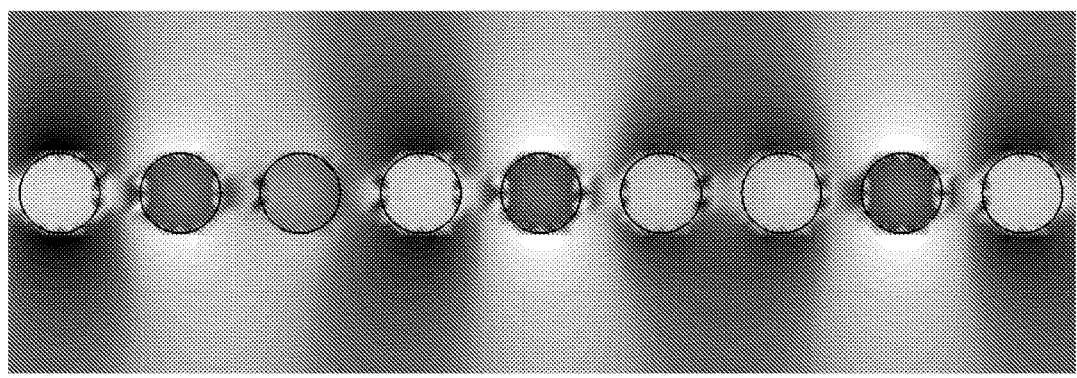
FIG. 6 depicts the calculated instantaneous electric field distribution where white and dark regions correspond to regions of electric field with negative and positive phase, respectively.
Figure 7:
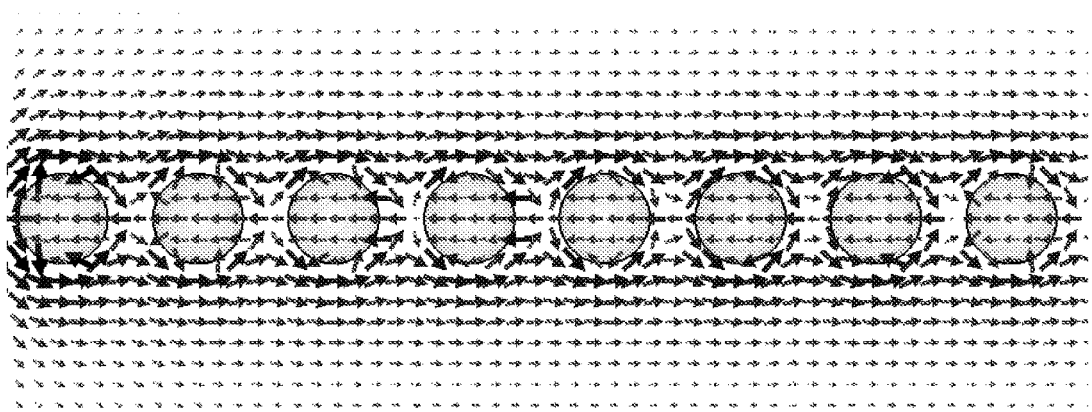
FIG. 7 illustrates the calculated time-averaged Poynting vectors associated with the geometry of FIG. 4.
Figure 8:
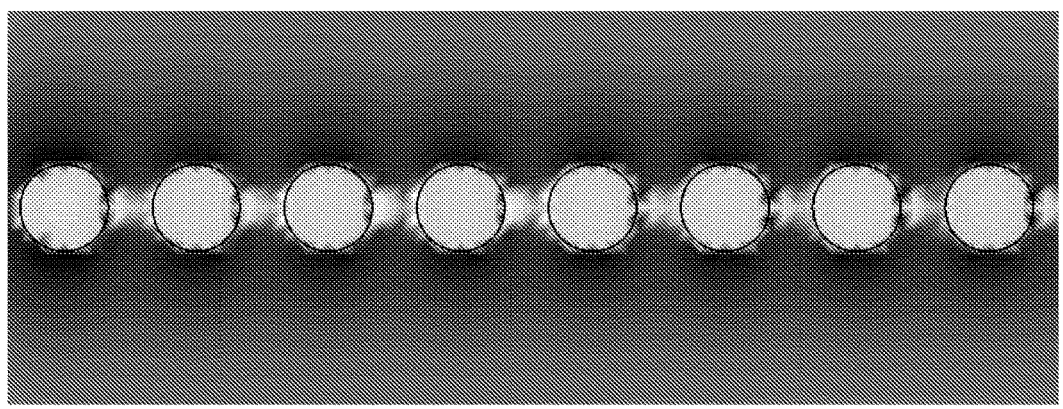
FIG. 8 illustrates the calculated time-averaged power density distribution associated with the geometry of FIG. 3, where white and dark regions correspond to regions of power flow towards the left and right, respectively.
Figure 9:
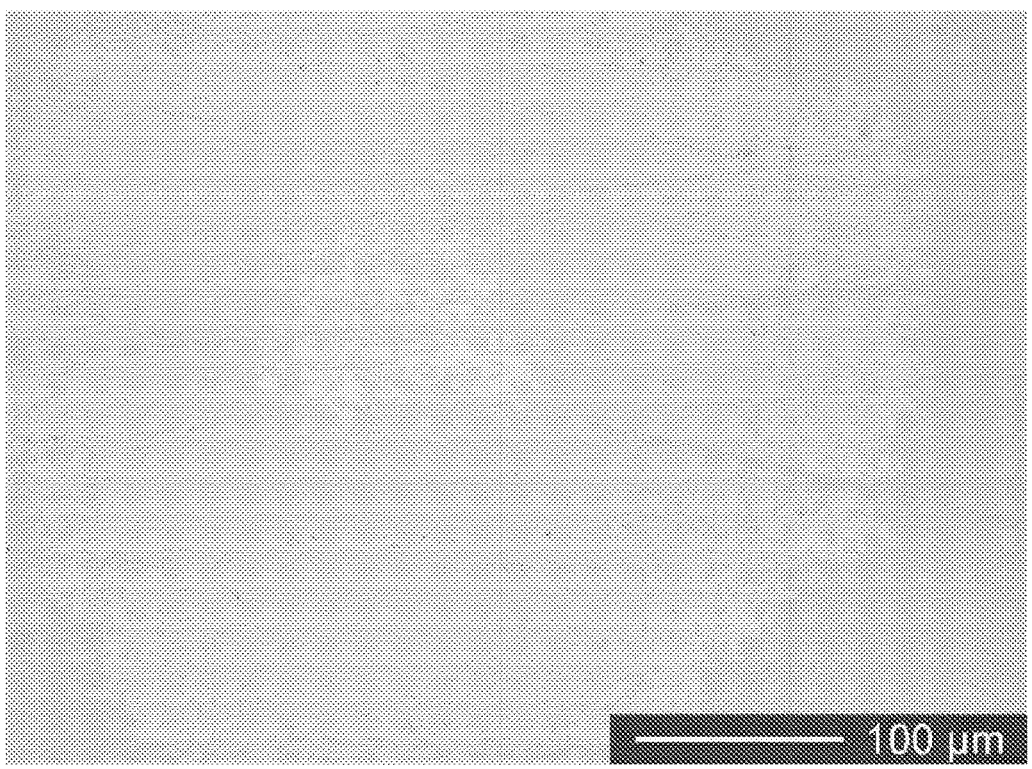
FIG. 9 depicts the untreated surface of polycarbonate as viewed under a 20× magnification optical microscope.

The inventive process of embedding particulates and other chemical agents into polymeric surfaces as disclosed here presents an improvement upon, and moreover a new manufacturing paradigm over, methods of direct incorporation (FIG. 1) and coatings (FIG. 2). In direct, or bulk, incorporation, the additive particles 102 are distributed throughout the bulk of the substrate 101. In coatings, the additive particles 203 confined to a secondary layer 202 atop the underlying substrate 201.

The additives to be impregnated into the surface of the substrate molding composition or the particles are suitably themselves in particle form. Such additives include the following as well as those disclosed elsewhere in related patent applications:

Multichromic agents, chemicochromic agents, piezochromic agents, thermochromic agents, photochromic agents, radiochromic agents, electrochromic agents, magnetochromic agents, radiochromic, thermochromic, toxin neutralizing agents, flavored substances, aromatic substances, catalysts, wetting agents, chemical elements, metals, salts, ceramics, polymers, gases, liquids, colloids, suspensions, emulsions, plasticizers, swelling agents, solvents, titanium oxide, UV-resistance agents, luminescent agents, antibacterial agents, antistatic agents, salts, indium tin oxide, behentrimonium chloride, cocamidopropyl betaine, phosphoric acid esters, phyletylene glycol ester, polyols, PEDOT:PSS, dinonylnaphthylsulfonic acid, ruthenium metalorganic dye, titanium oxide, titanium dioxide, scratch resistant agents, graphene, copper phthalocyanine, anti-fingerprint agents, anti-fog agents, UV-resistant agents, tinting agents, anti-reflective agents, IR-resistant agents, high reflectivity agents, optical filtration agents, fragrance, deodorizing agents, resins, lubricants, solubilizing agents, stabilizing agents, surfactants, fluorescent agents, activated charcoal, inks, toner particles, circuit elements, insulators, conductors, conductive fluids, magnetic inclusions, electronic inclusions, plasmonic inclusions, dielectric inclusions, resonant inclusions, luminescent molecules, fluorescent molecules, semiconductors, semiconductor dopants, cavities, inclusions, lenses, metamaterials, plasmonic media, nanoantennas, cold cathodes, electrodes, nanopyramids, quantum dots, nanocrystals, resonators, sensors, actuators, transducers, circuit elements, transistors, lasers, oscillators, photodetectors, photonic crystals, waveguides, amplifiers, modulators, switches, photovoltaic cells, light emitting diodes, couplers, and the like.

Antibacterial materials (e.g., silver particles or nanoparticles) are considered especially suitable. UV-reflecting materials (such as $TiO_2$, $ZnO$, and $BaSO_4$) are also especially suitable.

Other additives of use include activated coconut/catalytic carbon, KDF, SPG volcanic sand, magnetite, ceramic magnets, Tenko-seki, Bakuhan-ski mineral (Maifan, quartz porphyry), Taicho-seki, Taicho mineral, quartz, silicates. These particles are noted for their purifying, cleansing, and medicinal properties.

The following examples are illustrative only, and the user of ordinary skill will recognize that certain of the following examples may be accomplished by the methods and materials set forth in the listed related applications, all of which are incorporated herein by reference in their entirety.

Coatings Enhancement

By using the process described above and in the related applications can be used to embed particles into the surface of existing coatings. Many traditional coatings are comprised partially or entirely of polymers that can be softened and re-hardened. In this non-limiting example, solutions may be applied to the surface of an existing, 'set' or 'cured' coating which would cause it to soften. The desired additive particulates or liquids may be in solution with the softening solution, or separately added to the coated surface before, during, or after the polymer-softening solvent treats the coated surface. Subsequently at least one additive particulate would embed partially or fully into the surface of the coating.

Some coatings may be more difficult to soften than others (i.e., cross-linked polymers). Another non-limiting example would be conducting this process after the coating has been applied, but before it has fully cured or set. This could happen directly after the coating is applied or while it is in the process of being cured/set. It is believed that particles in powder form with a gas carrier to deposit them on and into the coating will be particularly effective, though a solution carrier may also be used. The present invention offers inherent advantages over conventional coatings treatments widely used in industry.

Creating coatings on plastic and rubber traditionally have been fraught with challenges because coatings cannot be applied to plastic surfaces as easily as for wood and metal substrates. Existing coatings for plastics often require multiple step applications involving adhesion promoters, base coats, and surface pre-treatments, in addition to the desired coating, and curing is usually time and/or energy intensive, involving heat or UV radiation. The present invention is compatible with a broad range of polymeric coatings, where additives in addition to the ones present on coatings may be applied in a post-manufacturing or a during-manufacturing step. This is a technologically valuable method, as placing additives into coating solutions during manufacturing may be problematic.

The disclosed methods include applying a fluid comprising a plurality of particles having a cross-sectional dimension in the range of from about 0.1 nanometers to about 100 microns to an wet coating material disposed on a substrate; and drying the wet coating material so as to give rise a coated article wherein at least one of the particles being at least partially embedded in the surface of the dried coating.

The term "wet coating" does not require that the coating be aqueous based (though the coating wet coating may be aqueous) or even be liquid. As previously discussed, "wet" may also refer to a solvent based coating or any coating that has a liquid phase, is at least partially liquid, or has properties resembling those of a liquid. Semisolids, gels, and the like are all amenable to the claimed methods.

In some embodiments, the wet coating material comprises a crosslinkable coating, which is curable and crosslinked. The applied fluid, particles, or both, may contain crosslinking agents or polymerization initiators.

Suitable polymerization initiators include, e.g., azo compounds, boron trifluoride, Ziegler catalysts, metallic halides, triethylaluminum, titanium tetrachloride, acetophenone, benzyl and benzoin compounds, benzophenone, cationic photoinitiators, thioxanthones, azobis(cyclohexanecarbonitrile), azobis(2-methylpropionamidine) dihydrochloride, azobis(2-methylpropionitrile), azobis(4-cyanovaleric acid), ammonium persulfate, hydroxymethanesulfinic acid monosodium salt dehydrate, potassium persulfate, sodium persulfate, N-tert-Butyl-N-(2-methyl-1-phenylpropyl)-O-(1-phenylethyl)hydroxylamine, bis(tert-amylperoxy)cyclohexane, butanone peroxide, benzoyl peroxide, cumene hydroperoxide, dicumyl peroxide, lauroyl peroxide, tert-butyl peracetate, tert-butyl peroxybenzoate, 2-(Diethylamino)ethyl methacrylate, ethyl 4-(dimethylamino)benzoate, isoamyl 4-(dimethylamino)benzoate, trimethyloxonium, other-onium salts, and the like.

Suitable crosslinking agents will be known to the user of ordinary skill in the art. A non-exclusive listing of such agents includes, for example, 2-benzothiazolethiol, tetramethylthiuram disulfide, imidoester, dimethyl suberimidate, formaldehyde, carbodiimide, hydrazide, isocyanate, maleimide, pyridyldithiol, diazirine, aryl azide, halacetyl, photo-leucine, photo-methionine, divinylbenzene, and the like. The optimal cross-linking agent will depend on the polymer or polymers being cross-linked, as well as on any constraints on process conditions.

The wet coating materials suitably comprise a fluid, gel, or semisolid or other material into which particles are embeddable. Polymer or monomer solutions or gels are considered suitable wet coating materials, including polymers that are capable of crosslinking and monomers that are subsequently polymerized. The wet coating material suitably, in some embodiments, includes two or more monomers that are subsequently polymerized.

The particles applied to the wet coating are suitably suspended in a fluid for application. The fluid is suitably essentially inert to the wet coating material, and the particles are also suitably essentially inert to the wet coating material. The particles are disposed in the fluid by way of mixing, sonicating, shaking, vibrating, flowing, stirring, agitating, and the like.

In one sample, non-limiting embodiment, a fluid containing particles is sprayed onto a wet (un-dried) coating atop a substrate. The wet coating is then dried, and the particles are left embedded in the coating. In this way, the user is able to impart functionality (by way of the particles) to the coating layer of a finished article.

This is particularly useful in cases where a finished article requires a coating (e.g., antireflective coating on eyeglasses), but the user may desire that the article have an additional functionality (e.g., antibacterial properties). By using the disclosed methods, the user is able to produce an article that includes the required coating layer and also includes additional functionality incorporated into that coating layer. As shown in FIG. 2, the particles may also be disposed on the substrate, and the wet coating is then applied atop the particles.

Suitable particles and fluids are described elsewhere herein. The fluid includes, e.g., a solvent, an aqueous solution, an ionic solution, a non-polar solvent, an organic solvent, a polar solvent, an aprotic solvent, a protic solvent, an inorganic solvent, an ionic fluid, and the like. Examples of these are set forth elsewhere herein.

The fluid may also include a salt, a surfactant, a stabilizer, or a viscosity-modifying additive (such as starch). These may be added so as to optimize the processability of the fluid. The additives may also be used to prevent (or promote) particle agglomeration.

As previously described, particles may be disposed in the fluid by mixing, sonicating, shaking, vibrating, flowing, stirring, agitating, and the like. Also as described elsewhere herein, the particles may include one or more agents that impart additional functionality.

In exemplary embodiments, the particles are, on average, embedded to the extent of not more than 100% of a characteristic dimension, or less than about 80% of a characteristic dimension, less than about 50% of a characteristic dimension, or less than about 25% of a characteristic dimension.

The particles suitably extend, on average, out from the surface of the substrate from about 0.1 nm to about 1 cm, or from about 10 nm to about 1 mm, or from about 100 nm to about 100 microns, or from about 0.1 microns to about 0.5 microns.

In some embodiments, essentially all of at least one region of the surface area of the coating material is embedded or otherwise occupied by particles. The methods may give rise to surfaces wherein less than 75% of the surface area of the coating material is embedded with particles, or less than about 50% of the surface area of the coating material is embedded with particles, or even less than about 5% of the surface area of the coating materials is embedded with particles.

Particles may be separated from one another by, on average, from about 1 nm to about 5 microns, or from about 10 nm to about 1 mm, or from abut 100 nm to about 1 micron, or from about 200 nm to about 500 nm. Particles may be separate or agglomerated.

The particles present in the fluid or embedded in the coating material may be monodisperse. In other embodiments, the particles are polydisperse, and the particle population may include particles of different sizes and materials. The particles are suitably distributed essentially evenly across the surface of the coating material.

In some embodiments, the particles are characterized as being harder than the dried coating material, although the dried coating material may also be harder than the particles. The particles may also be of comparable hardness to the coating material.

The claimed methods are useful in disposing particles into coatings atop articles of essentially any surface conformation. Articles have surfaces that are flat, cylindrical, polyhedral, sphereical, grooved, curved, arced, pitted, hollowed, or otherwise shaped are all amenable to the claimed methods.

The claimed methods are suitable for producing articles having a variety of uses. Such articles include purifiers, sanitizers, biocides, detectors, labelers, fluid treatment systems, electronic devices, and the like.

In some embodiments, the particles are affixed or held within the coating material. This may be accomplished by van der Waals forces, or even by application of a gradient that motivates or attracts one or more particles. Suitable gradients are described elsewhere herein, and include electric fields, magnetic fields, pressure/spraying, air flow, and the like.

As described elsewhere herein, the coating material suitably includes a polymer. A listing of suitable polymers is set forth elsewhere herein. The coating material may include wood, glass, minerals, metals, and the like. The coating may also include one or more of the following:

a biopolymer, a natural polymer, sugars, amino acids, proteins, natural fibers, synthetic fibers, a living tissue, a dead tissue, a living cell, a dead cell, or other biological material, such as: bamboo, bio-derived polyethylene, burlap, canvas, carbodiimide, cartilage, cellophane, celluloid, cellulose acetate (CA), cellulose acetate butyrate (CAB), cellulose nitrate, cellulose propionate (CP), cellulose, celluose acetate propionate (CAP), chitin, chitosan, coir, collagen, connective tissue, copper phthalocyanine, cotton cellulose, cuprammonium, elastin, epithelium, feathers, fibrin, fingernails, flax, fur, glycosaminoglycans, ground tissue, hair, hemp, jute, kenaf, keratin, leather, linen, linen, lyaluronic acid, muscle tissue, nervous tissue, nitrocellulose, osseous tissue, paper, papyrus, parchment, periosteum, plastarch, polypropylene fumarate), poly(vinylidene fluoride-trifluoroethylene), poly-3-hydroxybutyrate polyesters, polyamide, polycaprolactone, polyglycolic acid (PGA), polyglycolide, polylactic acid (PLA), polylactide acid plastics, polyphenylene vinylene, raffia, rayon, rice, silk, sisal, starch, starch-based plastics, toenails, vascular tissue, vinylidene fluoride, viscose, wood, wool, and the like.

The fluid may be sprayed onto or into the wet coating material. The fluid is also suitably applied by a roller, printer, or other applicator, such as a stencil, stamp, or mold. The applicator may be used so as to impress the particles at least partially into the coating such that at least a portion of the particles are at least partially embedded in the substrate. In some embodiments, the embedded particles place one or more structures disposed within the working composition in electronic communication with the environment exterior to the working composition.

The present invention also includes articles made according to the claimed methods. Such articles include, e.g., membranes, packaging, and the like.

A non-limiting depiction of the claimed invention is shown by FIG. 15. In that figure, a substrate 1501 has a wet coating material 1502 disposed on top. Particles 1503 in a fluid 1504 are then disposed atop the wet coating material 1502. The fluid 1504 is removed or evaporated and the wet coating material 1502 is dried, cured, or otherwise placed into final form. Without being bound to any particular theory, by action of pressure, weight, gradient field, or other force, the particles 1503 are at least partially embedded into the coating 1502 atop the substrate 1501. The particles 1503 are suitably securably embedded in the final coating material. The relative dimensions of the particles 1503, coating 1502, and substrate 1501 are illustrative only and do not serve to limit the scope of the claimed invention in any way.

EXAMPLE

Surface Enhanced Exercise Equipment

Shock absorbing mats with enhanced properties are useful in exercise and recreational settings. Such mats may be enhanced by the inclusion of various additives. For example, silver- and silver ion-containing particles may be embedded to kill microbes and to absorb phthalates/BPAs.

Other particles having health benefit include activated coconut/catalytic carbon, activated carbon, KDF, volcanic sand, magnetite, ceramic magnets, Tenko-seki, Bakuhan-ski mineral (Maifan, quartz porphyry), Taicho-seki, Taicho mineral, quartz, silicates. These particles are noted for their purifying, cleansing, and medicinal properties, and can be incorporated into articles made according to the disclosed methods.

Odor absorbing particles, and odor neutralizing particles may also be embedded (to eliminate odors from the mat material itself and from the mat users), as may fragrance particles (to impart a fragrance to the mats). Hard particles may be embedded to increase the anti-slip nature of the mat, even when wet. Antimicrobial additives such particles or fluids containing pleasant-smelling materials (e.g., cinnamon) may also be embedded.

EXAMPLE

Functional Tactile Surfaces

The process described above and in the related applications can be used to embed certain particles that can create a number of 'tactile' surface enhancements. Some non-limiting examples of using this process, are for creating self-cleaning, hydrophobic, oleophobic, and lipophobic surfaces. These surfaces suitable impart properties such as resisting or diminishing slippage, abrasion, crack propagation, fractures, fingerprints, oil adhesion, water adhesion, fat adhesion, and many other personally, commercially, and other useful properties.

Some non-limiting areas where these enhancements may be particularly important are: imparting anti-fingerprint, anti-oil, and abrasion-resistant particles onto tactile, interfacial plastic surfaces of cellular phones, cameras, PDAs, watches, eyeglass frames, eyeglass lenses, compact discs, monitors, game controllers, keyboards, mice, windows, paints, and interior and exterior automotive coatings.

Additives suitable for these applications include silica, silicates, minerals, metal oxides, metal powders, pigments, polymers, polydimethylsiloxane (PDMS), fluorosilanes, or fluorosiloxanes. The present invention, as described above and in the related applications, embeds such particles into a large range of natural and synthetic polymers.

Synthetic and natural polymer substrates used in the textiles and cosmetics industries include sugars, amino acids, peptides, proteins, rubbers, and fibers, which can be but not be limited to hair, fur, wool, silk, fingernails, toenails, feathers, linen, cotton, bioplastics, flax, hemp, jute, kenaf, leather, collagen, keratin, and chitin. These materials can be functionalized via the process described above and in related applications, with a number of enhancements including inks, glitter, luminescent particles, fluorescent particles, aromatic substances, biocidal elements, or de-odorizing agents.

EXAMPLE

Chemically Active Additives In Membrane Materials

The present invention is useful for imparting additional material, chemical, physical, and biologically enhancing properties to membranes which cannot be functionalized by prior methods, such as direct incorporation of additives or coatings. Direct incorporation of additive particles into thick membranes often is extremely difficult to manufacture, and coatings atop a membrane would obstruct the pores in the membrane. Some non-limiting examples of where this embedding process described here can improve existing methods are fuel-cell membranes and ultrafiltration membranes, into which the claimed methods embed active particles without obstructing the microscale and nanoscale pores in the membrane.

Arsenic is a naturally occurring semi-metal element that is odorless and colorless acute toxin to humans and animals. Arsenic contamination in drinking water is a real problem that causes sickness in millions of people sometimes even leading to death. One method of extracting arsenic from water to oxidize dissolved arsenic and ferrous ion moieties using ferrate, which produces ferric arsenate, an insoluble precipitate. This can be expressed by:

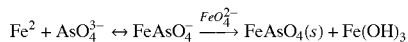

$$Fe^2 + AsO_4^{3-} \leftrightarrow FeAsO_4^- \xrightarrow{FeO_4^{2-}} FeAsO_4(s) + Fe(OH)_3$$

The reaction above is just one of many methods used for filtering Arsenic from water. Others include filtration, distillation, electrolysis, electrodeonization, sedimentation, chemical treatment, and osmosis. Similarly, arsenic is one of the many contaminants that can make water sources unsafe. Other contaminates include substances like mercury, lead, heavy-metals, bacteria, parasites, viruses, amoebas, etc. The present invention enables the incorporation of chemically active molecules/particles into the surface of polymeric objects to treat fluids.

Membrane bioreactors (MBR) are able to purify water with relatively low cost, high quality effluent, and small footprint, and are becoming an increasingly promising alternative to conventional biochemical wastewater treatment processes. MBRs comprise a suspended growth biological reactor integrated with an ultra, micro, or nanofiltration membrane system. The most challenging issues pertaining to MBRs include the high cost of membranes, low value of the tertiary effluent product, and rapid loss of performance due to the fouling of the membrane itself.

Research particularly notes that membrane fouling is the most serious problem affecting system performance, as fouling increases hydraulic resistance, which lowers permeate flux or requires the raising of the transmembrane pressure. These lead to increase in operating costs and decrease in efficiency. Factors influencing MBR filtration efficiency include the membrane characteristics: pore size, hydrophilicity, surface roughness, and surface charge; and sludge characteristics: biomass concentration, rheology, particle size and structure, colloidal concentration, temperature, and aeration. In addition to the formation of a filter cake, a decrease in the effective pore size or molecular weight cutoff is common in membrane particulate fouling.

Accordingly, one embodiment of this present invention is the creation of particle-embedded polymer objects that can be, but are not limited to, beads or pellets (hereafter pellets). The particles and/or molecules have active or passive functionalities or other purpose like but not limited to the following: antimicrobial, antiviral, antifungal, antibacterial, mercury absorbent/adsorbent, lead absorbent/adsorbent, arsenic absorbent/adsorbent, solvent absorbent/adsorbent, heavy-metal absorbent/adsorbent, toxin-neutralizing, etc.

These polymer pellets would have high active surface area, giving good efficacy, while simultaneously being inexpensive, easy to handle, and lightweight. The polymer pellets can be useful for the treatment of fluids, specifically the purification and filtration of water, by exposing the fluid to the pellets embedded with active molecules and/or particles.

Figure 13:
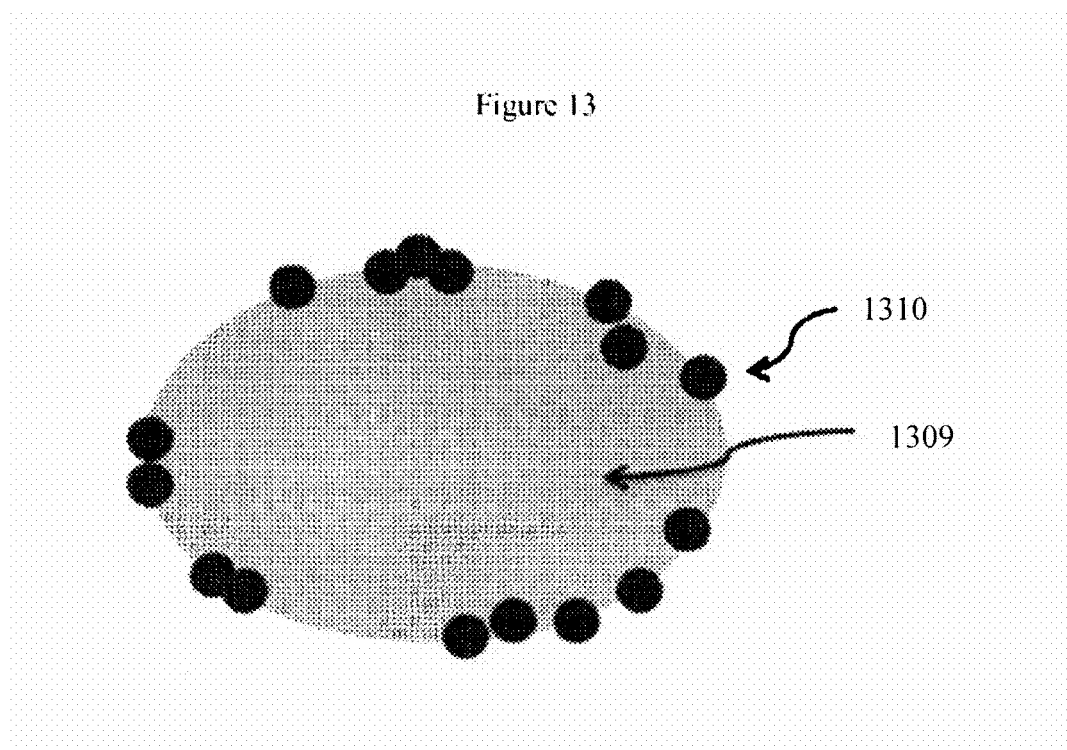
FIG. 13 depicts a polymer body having particles embedded therein according to the claimed methods.

FIG. 13 depicts a schematic cross-sectional view of a polymeric object (pellet) whose surface has been embedded with chemically-active particulates, and which shows an object 1309 (pellet) composed of a natural, synthetic, or biological polymer that is surface embedded with particles 1310. These polymer pellets could be used to treat, filter, and/or decontaminate fluids by contacting the fluid with the pellets. The chemically active particle additives to be impregnated into the surface of a polymeric object include the following:

Iron, iron ions, iron salts, magnetite, magnetite ions, ferrous oxide, ferrous ions, ferrate, ferrate ions, ferric iron, activated charcoal, alumina, chlorine, iodine, catalysts, metals, salts, ceramics, chemical elements, alloys, polymers, composites, gases, liquids, colloids, suspensions, emulsions, solvents, fragrance, de-odorizing a gents, carbon nanotubes, polymer nanotubes, metallic nanotubes, semiconducting nanotubes, metal nanotubes, insulated nanotubes, nanowires, nanorods, nanospheres, nanoshells, organometallic nanotubes, proteins, protein complexes, multichromic agents, chemicochromic agents, thermochromic agents, photochromic agents, toxin neutralizing agents, flavored substances, aromatic substances, chemically inert agents, solubilizing agents, stabilizing agents, surfactants, sensors, or any combination thereof.

Figure 12:
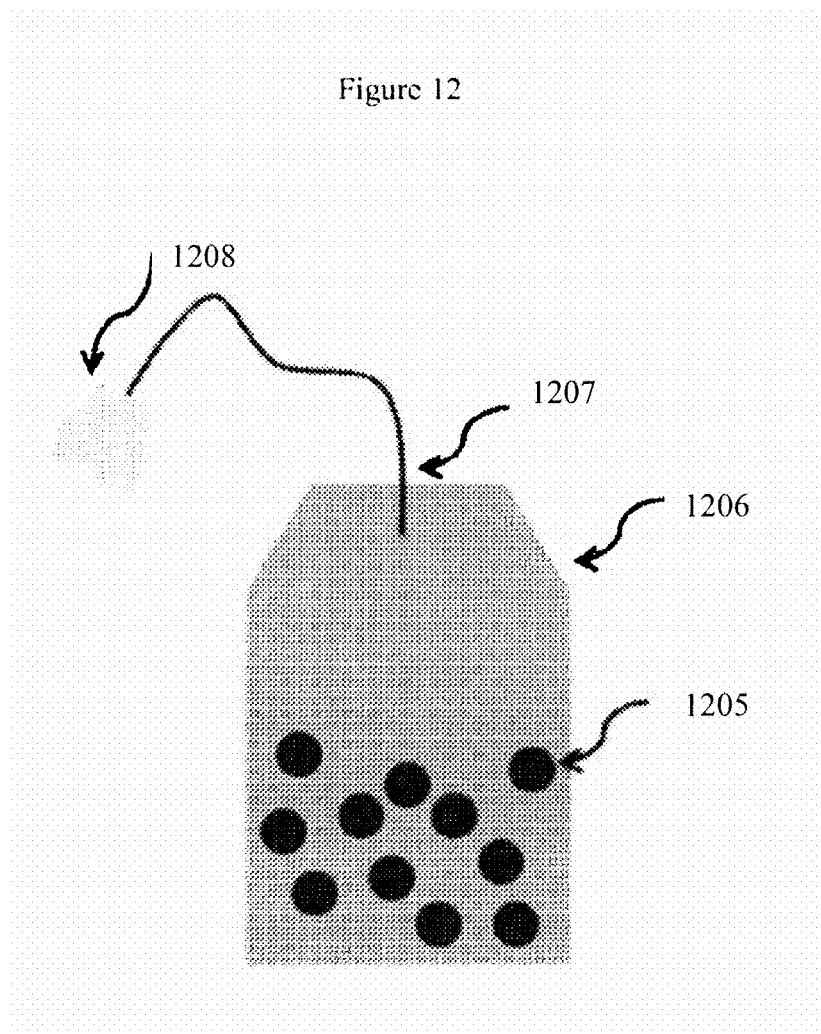
FIG. 12 depicts a sample water treatment device made according to the claimed methods.

There are many methods that could be used to contact fluids with the pellets. Another 'form factor' or method of contacting fluids with the pellets can be seen in FIG. 12. FIG. 12 depicts a schematic of a sachet containing polymeric objects whose surfaces are embedded with chemically-active particulates. Other non-limiting examples of this type of embodiment are using a fluid permeable or semi-permiable container such as a 'sachet', pouch, container, cage, net, or other method of keeping the enhanced pellet contained while allowing sufficient contact with the desired fluid. For this embodiment, it is recommended, but not a necessity that the smallest physical dimension of the polymeric object be larger than the smallest physical dimension of the pores or holes of the fluid-permeable sachet, such that the enhanced polymer pellets cannot escape their confinement in the container in stationary conditions, agitation, or thermal expansion.

One or more chemically functionalized polymer beads 1205 as in FIG. 12 are contained in the sachet 1206. Also shown is a container that optionally, has a string 1207 and paper tab 1208 that may or may not also be attached to the sachet 1206 for the purposes of allowing a user to place, position, and/or remove the sachet 1206 with marginal ease.

One or more chemically functionalized polymer beads as in FIG. 12 are contained in the sachet 6. Also shown is a container that optionally, has a string 7 and paper tab 8 that may or may not also be attached to the sachet 6 for the purposes of allowing a user to place, position, and/or remove the sachet with marginal ease.

Other form-factors of this embodiment could include but is not limited to a rod, a chain, a string, a tube, a wire, other structure, or any combination thereof that allows a user to place, position, remove, move, and/or agitate the container with marginal ease. Similarly the container may remain free and does not necessitate attachment to any structure.

The material of the fluid-permeable pellet container 6 may be comprised of but is not limited to paper, cellulose acetate, linen, cloth, cotton, polyester, organic fiber, synthetic fiber, netting, a metal/wood/plastic/concrete/alloy/'cage', chicken wire, wire, a rubber cage, a fabric, or any combination thereof.

Another suggested but non-limiting embodiment of the disclosed invention comprises the specific preparation of and use of iron-based particles bound and/or embedded to surface of polymeric beads, pipe linings, and/or drinking containers for arsenic remediation. Nano and micropowder magnetite when embedded into the surface of a polymeric bead can present a higher chemically active surface area to arsenic compounds in the surrounding liquid environment than to a bulk sized magnetite bead of comparable size to the polymer bead substrate.

This invention thus avoids the costs of using bulk pieces of magnetite or magnet-stabilized magnetite powder; the raw material cost of large fragments of magnetite is higher than that of the equivalent sized polymeric beads with embedded magnetite powder on the surface, and furthermore, the solution based surface treatment costs of the invention are extremely low. Such surface embedded polymer beads may be comprised of but not limited to PVC, TPU, ABS, PET, polycarbonate, polyethylene, polyester, polystyrene, or any combination thereof as well as of other polymers referenced in parent inventions and herein. These beads may be placed inside a water bottle, hydration reservoir, or other container for sanitation, water, and/or fluid purification purposes.

As a more specific non-limiting example of the disclosed invention, magnetite micro particles of average size of less than about 5 um (CAS1217-61-9, $Fe_3O_4$, Iron (II,III) oxide powder 98% Aldrich) are embedded into TPU pellets (Elastolan and Texin) of size around 1cm in diameter (the pellets have an approximate aspect ratio of 1).

After the solution had been removed via evaporation, the resulting, pellets with at least one magnetite particle embedded therein, were placed into a bottle containing water contaminated with arsenic. As the pellets, which now contained some amount of magnetite embedded in their surface, contacted the water in the bottle the magnetite was able to remove arsenic from the water to a certain degree.

Another embodiment of the use of this invention is to treat fluids by flowing the fluid through a container, filter, passageway, pipe, tube, or other such conduit that has a plurality of these enhanced polymer pellets. As the fluid contacts the surface of the pellets and hence the now surface-active molecules and/or particles, the fluid would be treated. This invention also includes the use of having the container, filter, passageway, pipe, tube of other such conduit's surface enhanced with the chemically active molecules and/or particles.

Membranes embedded with particles and/or molecules using the claimed methods are useful as proton exchange membranes for fuel cells, water filtration membranes, fluid filtration membranes, air filters, and catalysis devices for chemical production. Proton exchange membrane fuel cell substrate materials may be comprised of microporous perfluorosulfonic acid, PTFE copolymer, polybenzimidazole, polyarylenes, poly(arylene ether sulphone), or any combination thereof.

One non-limiting embodiment of this invention is for catalysis applications-wherein platinum and/or other metals and alloys may be implanted into proton exchange membranes in fuel cells to catalyze hydrogen oxidation and oxygen reduction. The embedding of particles to support the creation of catalyst layer in Membrane Electrode Assemblies.

This process is considered especially suitable for use on substrates that are chemically inert and would accordingly be unsuitable for other embedding methods, in particular those methods that rely upon chemically altering the substrate. Thus, the present methods enable the embedding of particles into materials such as polyethylene, polypropylene, Teflon™, and the like.

Ultra, micro, or nanofiltration membranes may be enhanced with a range of materials including but not limited to: reinforcements, self-healing properties, antimicrobial agents, hydrophobic or hydrophilic agents, surface roughening additives, electrically or magnetically charged particles, anti-fouling agents, anti-biofilm formation agents, or any combination thereof. Such particulate and/or molecular additives may be fully or partially embedded into the surface of the membranes to alter and/or enhance membrane performance.

Another non-limiting embodiment of the invention is to help prevent particulate of biofouling of the membranes. Particulate fouling is the dominant form of fouling in micro and ultrafiltration systems. Biofouling, the adhesion and growth of microorganisms and biofilms on the membrane surface, can be inhibited with the introduction of charged or ionic additives, antimicrobial agents, hydrophobic or hydrophilic materials, surface smoothening chemical treatments to reduce surface area. For instance, if the foulant colloids, macroorganics, microorganisms, or particulates have the same charge sign as that of the membrane surface, they will be repelled by the membrane due to electrostatic forces, decreasing the overall adsorption. Many foulant colloids and macroorganics are negatively charged at neutral and high pH conditions, so it is desirable to negatively charge the membrane. It is also often desirable to render the filtration membrane hydrophilic to raise permeability and lower affinity with aromatic foulants.

Another non-limiting embodiment of the invention is to impart active functionality to a membrane. For example, acetate (cellulose acetate, etc) cloth may be embedded with magnetite nanoparticles or microparticles using the methods described in this application and the previously referenced inventions, as well as other methods. The cloth may then serve as a membrane for purifying water and other fluids of heavy metal contaminants such as arsenic, as well as a host of other contaminants.

Such cloth may also be embedded with a variety of other particles such as the ones mentioned in this and previous invention filings referenced above to prevent fouling of the cloth and to have an active effect on microbes in the water such as to bind them to the cloth and/or to kill them and/or prevent them from adhering and/or inhibit their reproduction. The cloth used in this example may be any synthetic cloth or membrane such as those composed of nylon, polyester, rayon, any of the polymers referenced in this and previously referenced invention filings, and any other polymers.

EXAMPLE

Advanced Hydration Reservoir

Existing hydration reservoirs suffer from leaks, spills, punctures, and other effects that cause liquids to leak out of the reservoirs and subsequently wet the user's backpack itself, the contents, and/or the wearer. The bag is not limited to a back-pack style bag, but could be a 'fanny-pack', a duffel bag, etc.

The present invention can be used to form a water-proof, or highly-water resistant lining in the pocket that is designed to hold the hydration reservoir. This lining would protect the contents of the bag, the bag itself, as well as protect the wearer from getting exposed to fluids like water, electrolyte drinks, etc. that leak out of the pack.

One exemplary embodiment is the endothermic evaporation of a liquid to cool a container and/or its contents. A non-limiting example of this invention would be a moisture absorbing material such as moist fabric being place around or on a water bottle or hydration reservoir or water vessel. Then, as the moisture in that material evaporates, heat from the container is absorbed, thus cooling the contents of the container stored therein.

It is desirable to take a chilled water container on an outing that avoids the mess of ice melting, the dilution of a beverage due to ice melting, the bulkiness or weight of cooling boxes and powered refrigerators, losing refrigerated temperatures for extended periods of time, and high cost. Such convenient, low cost, and versatile methods of evaporative cooling and refrigeration are especially important in locales without electricity or where electricity is expensive or in short supply. The transport of biomedical materials, medicines, and vaccines, for instance, into remote regions often requires refrigeration, which can be challenging to provide.

One unique and inventive feature of the disclosed self-chilling apparatus is that the porous evaporative cooling layer may be embedded with functional antimicrobial particulates, though this need not be the case.

Porous walls are able to provide cooling via controlled evaporation, which is not possible with a container having a monolithic, non-porous surface because the monolithic container cannot transport moisture across its surface via solution or diffusion. The small holes inside porous materials serve as passageways to transport moisture or vapor efficiently. The cooling effect is thus more uniform and pronounced across a membrane which allows for a more even distribution of evaporation in the presence of thermal gradients.

The permeability of the membrane is the key determinant factor for maximal evaporative cooling of water directly proportional to a moisture or vapor transmission rate. The permeability is the mathematical product of the diffusion and solubility coefficients. A large problem associated with such porous evaporative cooling membranes is the possibility of contamination, where bacteria, viruses, mold, and fungi from air, dirt, rain, or mud in contact with the membrane may diffuse or be transported through the pores, and even proliferate due to the moist environment of the membrane. Biocidal agents impregnated into the membrane surface ameliorate the growth of such unwanted microbes. In addition, multichromic agents may be impregnated as well into the membrane to signal environmental changes in temperature, biological elements, toxins, pathogens, pollutants, light intensity, mechanical stress, strain, other factors, and combinations thereof.

Fluids from the hydration reservoir can be sucked through a straw or hose reaching from the bladder without the need to remove the hydration reservoir from the cooling apparatus, as the cooling device is integrated onto the surface of the water bladder.

The water bladder may include at least two (2) layers. The material of the water bladder comprises any polymer or water-containing material. These materials of the hydration reservoir and of the evaporative layer may be flexible or rigid, natural or synthetic, and include but are not limited to: thermoplastics, thermosets, elastomers, thermoplastic elastomers, polyurethane, polycarbonate, polypropylene, poly vinyl chloride, polyester, copolyester, polystyrene, nylon, Teflon, polyethylene, polytetrafluoroethylene, poly (methyl mechacrylate) copolymer, polyether-urethane, polypropylene fumarate), polybutylene, polymethylpentene, ethylene copolymer, polyvinylfluoride, polyvinylidinefluoride, polyethylenetetrafluoroethylene, florinated ethylene propylene, polyperfluoroalkoxyethylene, polyvinyldichloride, sugars, amino acids, proteins, rubbers, natural fibers, synthetic fibers, a living tissue, a dead tissue, waxes, polyolefins, cellophane, cuprammonium, cotton cellulose, viscose, bamboo, bio-derived polyethylene, burlap, canvas, coir, cotton, flax, hemp, jute, kenaf, papyrus, paper, parchment, polyamide, polylactide acid plastics, poly-3-hydroxybutyrate polyesters, raffia, rice, sisal, starch, starch-based plastics, cellulose, cellulose acetate, wood, cellulose nitrate, or any monomer, copolymer, combination, blends, or composite thereof. Thermoplastics, such as polyethylene, are considered especially suitable.

The coolant is suitably water, but can also be water vapor, steam, water, ice, helium, nitrogen, carbon dioxide, sulfur hexafluoride, oils, solvents, liquids, mineral oils, silicone oils, antifreeze, fluorocarbon oils, Freon™, alcohols, acetone, and the like.

The evaporative layer comprises a porous membrane which can be an outer layer in contact with the waterproof hydration reservoir material inside. This membrane facilitates water transport across the membrane as well as evaporation.

Figure 10:
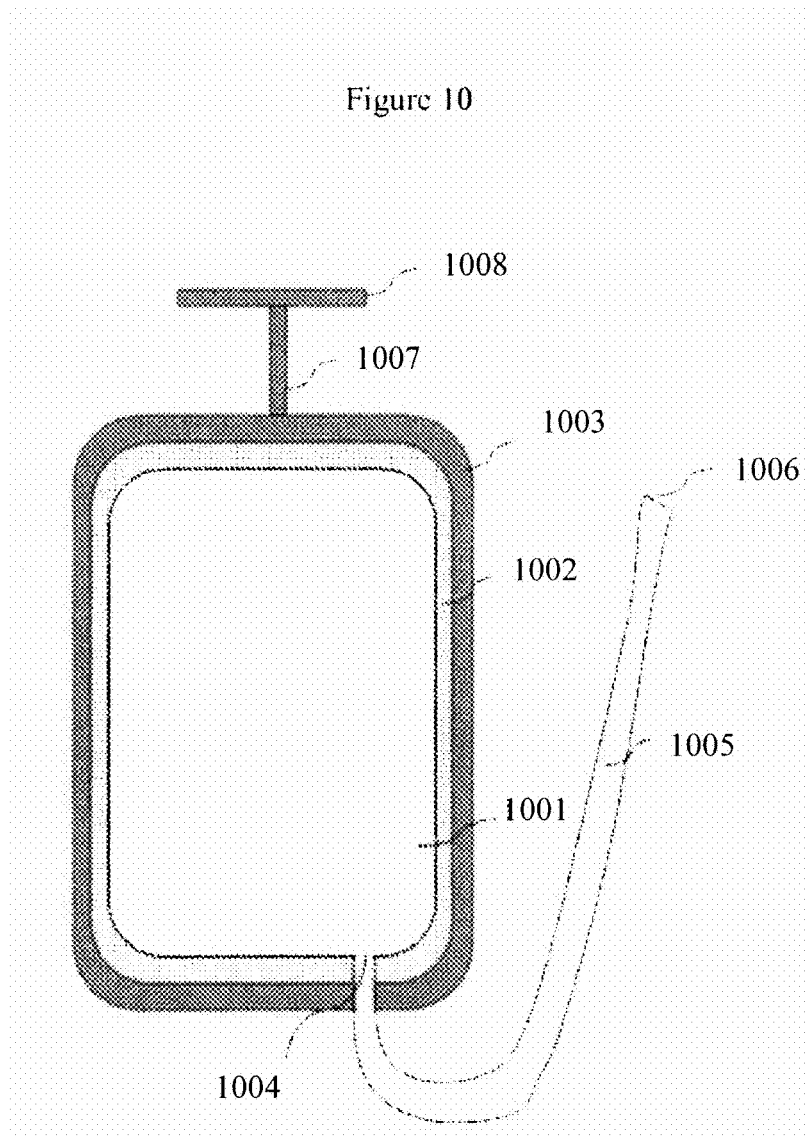
FIG. 10 depicts a hydration device made according to the claimed invention.
Figure 11:
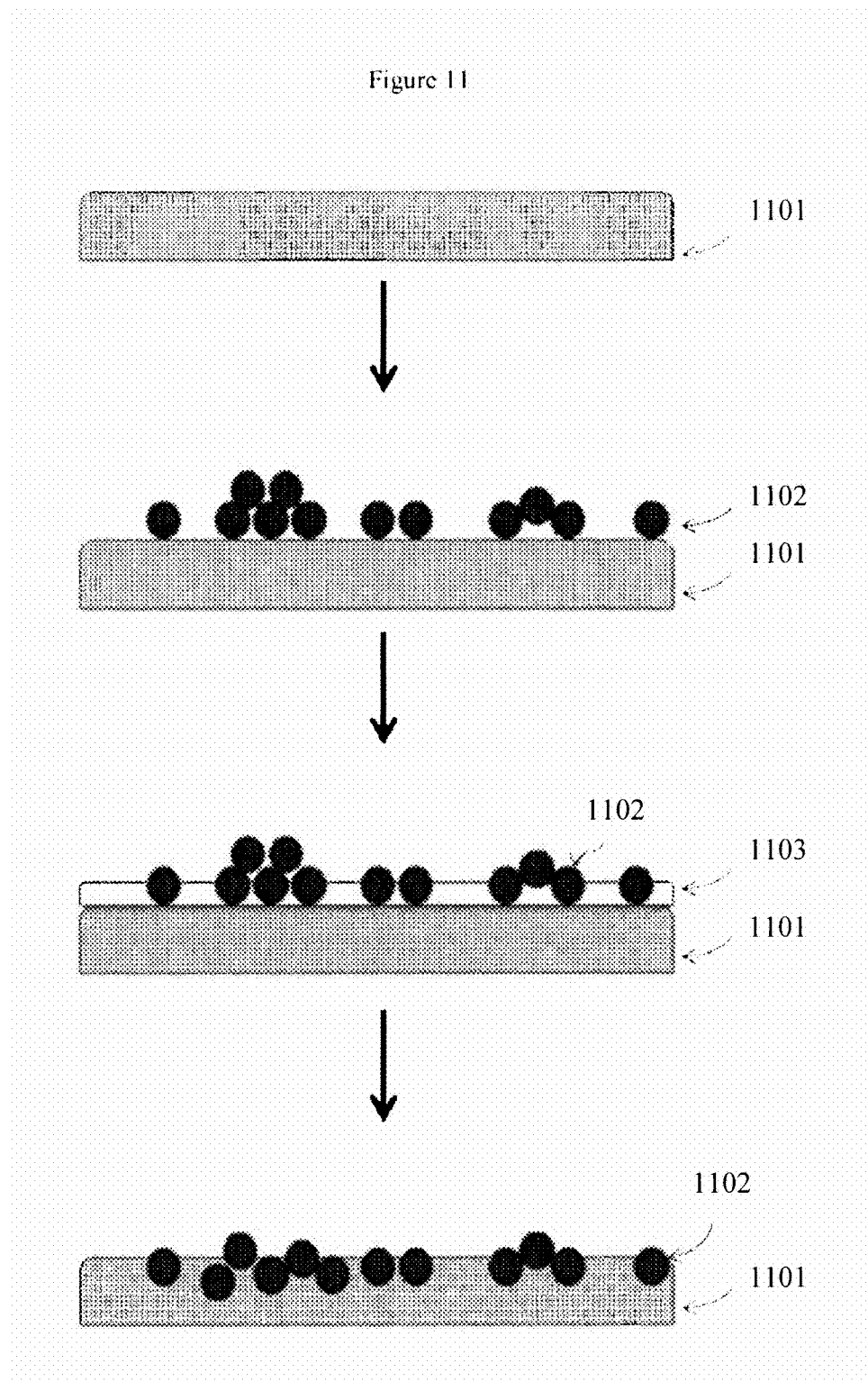
FIG. 11 depicts a schematic cross-sectional view of a process where additive particles 1102 that have been applied and embedded to one surface of a polymeric substrate 1101 using a fluid 1103.

An alternative design is where the hydration reservoir and the evaporative layer are not materially integrated on top of one another, but the evaporative layers are connected to the hydration reservoir via capillary channels, which allow the transport of coolant from the layer surrounding the hydration reservoir into an area which is not in direct contact with the hydration reservoir. A preferred but non-limiting embodiment of this is FIG. 10 depicts an exemplary cooling hydration reservoir. The waterproof material of the hydration reservoir itself 1002, which does not include the evaporative layer, encapsulates the fluid contained in region 1001. The fluid can be sucked out by the user via the opening 1004 that leads the fluid out through the straw or hose 1005. The hygienic mouthpiece 1006 may comprise a valve or cap that may be treated with antimicrobial agents. The evaporative layer 1003 surrounding the interior hydration reservoir material 1002 is soaked with coolant, such that when the coolant evaporates heat is absorbed from the interior hydration reservoir contents, thereby cooling the contents.

The coolant vapor may directly evaporate from all surfaces of layer 1003, or a further vapor impermeable membrane outside of this layer 1003 can channel the vapor out through capillary channel 1007, which is in contact with membrane 1003 and allows for the permeation of coolant into the capillary channel to another membrane 1008, which may be located on the outside of a backpack, which houses the entire hydration reservoir. Such an apparatus is useful for cases when the hydration reservoir is housed inside the interior of a backpack, and the other items inside the backpack should not get wet, which may happen when coolant evaporates from membrane 1003 and condenses within the backpack.

Furthermore, evaporation is more easily facilitated when the evaporative membrane 1008 is on the exterior of the backpack and the ambient temperature outside of the backpack may be higher than inside the backpack. Heat from outside the backpack may be convectively, conductively, or radiatively transferred to the evaporative membrane 1008 more g to effectively than to evaporative membrane 1003 directly, which will accelerate the rate of evaporation of the coolant. For example, intense sunlight incident on the exterior of the backpack may more readily heat evaporative membrane 1008, as this may be located on the exterior of the backpack facing the ambient light source.

The evaporative cooling membranes 1003 and 1008 may contain capillary pores or channels and/or be impregnated with additives, comprising biocidal and/or multichromic agents. The surrounding material 1002 may also be impregnated with antimicrobial agents.

EXAMPLE

Optical and Opthalmic Material Enhancements

The present invention is able to enhance surfaces, of which some non-limiting examples include polycarbonate, Trivex, high-index, acrylic, and ethylene glycol diallyl dicarbonate (CR-39) polymers, which are standard materials used in conventional ophthalmic lenses. Cellulose acetate, nylon, polyamides, cellulose propionate, Kevlar, optyl, polycarbonate, wood, leather, copolyamide composites, and carbon fiber graphic composites, and other materials used in plastic eyeglass or other optical frames, can be functionally modified by the present invention. Luminescent, antibacterial, pigment, antistatic, scratch resistant, anti-fingerprint, anti-fog, UV-resistant, tinting, anti-reflective, IR-resistant, high reflectivity mirror, optical filtration, fragrance, deodorizing, resin, lubricant, solubilizing, stabilizing, surfactant, photochromic, or fluorescent agents.

As one non-limiting example, photochromic eyeglass lenses are conventionally made by incorporating silver chloride or silver halide throughout the entire bulk of the lens. However, this method suffers from major drawbacks having to do with the polymerization chemistry of ethylene glycol diallyl dicarbonate, the most widespread monomer used for producing plastic eyeglass lenses. Following the polymerization of this monomer, the polymerization catalyst, often isopropyl percarbonate, inhibits the photochromic properties of the photochromic dyes, such that it has been difficult to directly incorporate these dyes into organic material lenses. The present methods may this embed photochromic materials into lens plastics without need for heat treatments.

EXAMPLE

Multichromic Additives for Smart Materials

As described above and in the related applications, disclosed are processes for embedding or impregnation of additive particulates, liquids, or gases into the surface of a polymer, wherein the additives change color in response to environmental changes or stimuli.

Some non-limiting examples are that upon exposure to thermal, mechanical, electric, magnetic, optical, chemical, biological, or radioactive changes or stimuli, multichromic agents will experience a shift in the electromagnetic absorption, scattering, or reflection frequency and/or amplitude. Changes in the visible spectrum may be the most useful because they will not require subsequent equipment to view.

One advantage that this invention imparts is that the process is a simple, cost-efficient, and post-manufacturing method that represents a drastic improvement in existing manufacturing processes. Existing manufacturing methods for creating polymers incorporated with multichromic dyes include extrusion, calendaring, injection molding, transfer molding, compression molding, solution casting, adsorption, absorption, coating, and the like. These processes, however, are labor-intensive and can be incompatible with multichromic additives.

Some non-limiting applications for multichromic additives include packaging materials, where such materials can be used to show the presence of spoilage, toxins, pathogens, temperature, irradiation, mechanical strain, and the like. Many of the shifts in optical extinction or reflection frequencies of the multichromic additives result in a visible color change, which may be immediately identifiable by consumers. A non-exclusive listing of additives includes multichromic, chemicochromic, piezochromic, thermochromic, hydrochromic, radiochromic, electrochromic, magnetochromic, photochromic agents, or any combination thereof.

Multichromic (i.e., piezochomic, chemicromic, photochromic, magnetochromic, stress chromic, radiochromic, thermochromic) agents include, inter alia, polyalkylbenzoindolino spiro naphthoxazines, 3-hydroxypropionitrile, 3,3'-oxydipropionitrile, 2-acetylbutyrolactone, 2-methylglutaronitrile, 3-methylsulfolane, benzoindolinospiropyran, triarylmethane leuco dyes, metal dithizonates, 1',3'-dihydro-1',3'3'-trimethyl-6-nitrospiro(2H-1-benzopyran-2,2'-(2H)-indole), crystal violet, cresolphthalein, bromocresol green, methyl red, thymol phthaline, malachite green, alizarin red, phloxine B, spiro(isobenzofuran-1(3H), 9'-(9H) xanthen)-3-one, 2'-(bisphenylmethyl)amino-6-(diethylamino), crystal violet lactone, rosaniline (3,3-bis(4-amino-phenyl)-6-aminophthalide, 3,3-bis(4-dimethylaminophenyl)-6-dimethyl amino phthalide, 2-anilino-3-methyl-6-diethyl-amino fluoran, 3-(4-dimethylamino) phenyl-3-(di(4-octyl)phenylamino) t-(3H)-isobenzofuranone, 3,3-bis(1-butyl-2-methylindol-3-yl) phthalide, triaryl imidazole dimers of Bis-2,4,5-triaryl imidazoles, 2, 2',4,4'5,5'-hexaphenyl bisimidazole; 2,2',4,4' 5,5'-hexa-p-tolyl bisimidazole, 2,2',4,4' 5,5'-hexa-p-chlorophenyl bisimidazole, 2,2'-di-p-chlorophenyl-4,4',5,5'-tetraphenyl bisimidazole, 2,2'-di-p-Anisyl-4,4',5,5'-tetraphenyl bisimidazole, 2,2'-di-p-tolyl-4,4',5,5'-tetraphenyl bisimidazole, helianthrone, mesonaphthobianthrone, bistetra phenyl pyrrole, xanthylidene anthrone, dixanthylene, bianthrones, fulgides, triaryl methane leuco-cyanides, triaryl methane leucohydroxides, triaryl methane leucobisulfites, silver halides, oxazines, naphthopyrans, nitrospiropyran, triarylmethanes, stilbenes, azastilbenes, nitrones, fulgides, spiropyrans, naphthopyrans, spiro-oxazines, quinines, hexaarylbiimidazole, and the like.

Suggested but non-limiting polymeric substrates of interest include beverage containers, wrapping, bottles, and the like. Such items may have synthetic or natural polymer compositions.

EXAMPLE

Exotic, novel, and novelty materials

Using the process described above and in the related applications can make the process of fabricating exotic and novel materials more practical. As a non-limiting example, superhydrophobic or superhydrophilic materials are useful for accumulating moisture in arid conditions and creating antifogging surfaces.

Another non-limiting example is to embed chemicochromic particles into the plastic or rubber of water bottles, packs, bladders, or cups such that the particles change color during exposure to chemical or biological triggers present in the water.

As another example, nanostructure-embedded polymeric nanocomposites have conferred a plethora of structural, optical, fire retardancy, chemical, and electronic improvements upon the original polymer. The present invention, as described above and in related applications, provides an improvement and/or alternative to existing methods of polymeric nanocomposite synthesis.

EXAMPLE

Semiconductor Devices And Related Methods:

The intrinsic cost of many photovoltaic (PV) devices and fuel cell polymeric membranes remains high due to the slow rate of the high-vacuum deposition procedures used to grow high purity crystals or highly controlled film dimensions necessary to achieve sufficient carrier lifetimes. The present invention allows for surface embedding and surface incorporation of additive particles and molecules at cost-efficient, single step, room temperature and pressure conditions, thus presenting an improvement upon current semiconductor modification techniques.

The external quantum efficiency of a photovoltaic cell based on exciton dissociation at a donor-acceptor interface is:

$$\eta_{EQE} = \eta_A \eta_{ED} \eta_{CC},$$

where $\eta_A$ is the absorption efficiency, $\eta_{ED}$ is the exciton diffusion efficiency, or the fraction of photogenerated excitons reaching a donor-acceptor interface before recombination, and $\eta_{CC}$ is the carrier collection efficiency, or the probability of a free carrier reaching its corresponding electrode. Since the exciton diffusion length is typically an order of magnitude smaller than the optical absorption length, a sizable fraction of the photogenerated excitons remains unused for photocurrent generation, limiting $\eta_{EQE}$ and the power conversion efficiency. Inclusions embedded into the surface of organic electronic materials via the method disclosed, for example, have the capability of tuning the dielectric constant, extinction, absorption, conductivity, polarizability, magnetization, and/or optical properties of the surface of the object.

Organic semiconductors have various important properties similar to their inorganic counterparts, and can thus be used for light emission, light absorption, and switching applications. For instance, crystalline polymers display electronic bands similar to those in inorganic semiconductors. The present invention described here is capable of doping and/or implanting particles into the surface of an organic semiconductor material in a simple, cost-efficient, and readily adoptable fashion.

Organic photovoltaic devices (OPVs) are created from a coating process, such as spin coating or inkjet printing, thin films of organic semiconducting materials, such as polymers and small-molecule compounds. OPVs represent a promising cost-efficient alternative technology for traditional 1st and 2nd generation photovoltaics in their ability to cover large areas and flexible plastic substrates. There has been increasing academic, industrial, and commercial research to show that incorporating additive structures into the semiconducting junctions and/or photoactive layers of photovoltaic cells can enhance their photovoltaic efficiency. Carbon nanotubes dispersed throughout the photoactive layer of a photovoltaic cell enhance the local electric fields at semiconductor junctions that aid in exciton splitting and charge carrier transport.

Photoinduced charge transfer between conjugated polymers (as electron donors) and carbon nanotubes and other fullerene derivatives (as electron acceptors) dispersed inside the polymer matrix allow for significantly higher efficiency OPV devices. This enhancement is due to the internal polymer-nanotube junctions increasing exciton dissociation and balanced bipolar transport throughout the composite. Composites of poly(3-octylthiophene) (P3OT) serving as the photoexcited electron donor have been blended with SWNTs, which permit charge separation of the photogenerated excitons and subsequent charge transfer by transporting carriers along the nanotube length to their respective electron and hole collecting contacts. One common method of fabricating OPV devices involves spin coating ITO onto a glass substrate, spin coating PEDOT:PSS on top of the ITO substrate, and subsequently spin coating a solution of P3OT-SWNT in chloroform as the photoactive layer. The presence of polymer-nanotube junctions are able to increase the photocurrent through the device over two orders of magnitude compared to that of monolithic diodes, as well as doubling the open circuit voltage. The nanotubes may be disposed within the surface of the polymer so as to create a network of nanotubes that may be conductive.

This invention creates an alternative treatment for multijunction PV cells that use lateral arrays of semiconductor nanowires or other nanostructures of various bandgaps as elements that convert optical energy into electrical energy. Multijunction PV devices employ stacked layers of various materials that filter and absorb incident radiation at different spectrum portions, achieving 70-80% of single wavelength conversion. Problems with thin films include photoexcitons recombining before carrier collection. Nanoscale heterojunctions and structures can mitigate such recombination through traps. These nanostructures may be grown by the vapor-liquid-solid (VLS) method or the sol-gel approach, which are both adoptable to low-cost manufacturing in industry. Si, Ge, $TiO_2$, and III-V semiconductors are candidates for materials that can capture solar spectrum radiation. The semiconductor nanostructures are deposited on top of a nanostructured metal electrode array, which also serves as a lateral concentrator to enhance light absorption in the photoactive nanocomposite monolayer.

Carbon nanotubes are allotropes of carbon that possess a wide range of novel properties useful for myriad applications in nanotechnology, optics, electronics, advanced materials, filtration, batteries, etc. Such properties include extremely high thermal conductivity, ballistic conduction, and extraordinary mechanical strength. The band structure of a carbon nanotube is strongly dependent on the diameter of the tube, so tuning the optical and electronic properties is possible via controlled synthesis methods. The semiconducting or metallic properties of the nanotube also depend on its molecular configuration and structure. Various methods are known in the art to distribute nanotubes within a polymeric matrix, including (1) solution mixing of the nanotubes polymer; (2) sonication and melt processing; (3) melt blending and; (4) in-situ polymerization in the presence of nanotubes. But because these methods have inherent disadvantages, the present methods are useful in embedding carbon nanotubes.

The present invention is applicable to a number of types of devices, including but not limited to solution-processed electronic and optoelectronic devices, which are known to offer low cost, large device area, physical flexibility, and convenient materials integration compared to conventional epitaxially grown, lattice-matched, crystalline semiconductor devices. The present invention is also applicable to but not limited to devices like excitonic solar cells, including organic, hybrid organic-inorganic, and dye-sensitized cells (DSCs). DSCs, extremely high efficiency and stable excitonic photocell, rely on large surface area and thick nanoparticle films for the adsorption of light-harvesting molecules.

The additive particulates or molecules may include but are not limited to one or a combination of solid particulates, liquids, or gases each in a dispersed phase distinct, semi-distinct, or not distinct with respect to the continuous phase of the dispersion medium. This additive(s) and solution can be but are not limited to be a homogenous mixture, a heterogeneous mixture, a solution, a suspension, a colloid, aerosol, sol, emulsion, or gel contained in may be dispensed onto the polymeric substrate surface in a controlled fashion or in a statistically distributed fashion.

The polymeric substrates may include virtually any synthetic polymer or composite. These include but are not limited to the following as well as those mentioned in the parent applications referenced above:

Thermoplastics, thermosets, elastomers, pentacene, poly (3,4-ethylenedioxythiophene) (PEDOT), poly(styrenesulfonate) (PSS), poly(3-hexylthiophene) (P3HT), poly(3-octylthiophene) (P3OT), poly(C-61-butyric acid-methyl ester) (PCBM), poly[2-methoxy-5-(2'-ethyl-hexyloxy)-1,4-phenylene vinylene] (MEH-PPV), polyolefins, liquid crystal polymers, polyurethane, polycarbonate, polyester, copolyester, poly(methyl mechacrylate) copolymer, tetrafluoroethylene, sulfonated tetrafluoroethylene copolymer, ionomers, fluorinated ionomers, polymer electrolyte membranes, ethanesulfonyl fluoride, 2-[1-[difluoro-[(trifluoroethenyl)oxy] methyl]-1,2,2,2-tetrafluoroethoxy]-1,1,2,2,-tetrafluoro-, with tetrafluoroethylene, tetrafluoroethylene-perfluoro-3,6-dioxa-4-methyl-7-octenesulfonic acid copolymer, polypropylene, polybutene, polyisobutene, polyisoprene, polystyrene, polylactic acid, polyglycolide, polyglycolic acid, polycaprolactone, vinylidene fluoride, trifluoroethylene, poly(vinylidene fluoride-trifluoroethylene), polyphenylene vinylene, copper phthalocyanine, graphene, poly(propylene fumarate), cellophane, cuprammonium, or any monomer, copolymer, combination, blend, or composite thereof.

The additives to be impregnated into the surface of the substrate 1 may include but are not limited to any of the following as well as those mentioned in the parent inventions referenced above:

Carbon nanotubes, polymer nanotubes, metallic nanotubes, semiconducting nanotubes, metal nanotubes, insulated nanotubes, nanowires, nanorods, nanoantennas, nanospheres, nanoshells, organometallic nanotubes, VAULT proteins, quantum dots, dopants, optical concentrating and trapping structures, optical rectennas, "nano flakes", nanocoaxial structures, waveguiding structures, metallic nanocrystals, semiconducting nanocrystals, multichromic agents, chemicochromic agents, piezochromic agents, thermochromic agents, photochromic agents, radiochromic agents, electrochromic agents, silver nitrate, mercury, magnetochromic agents, toxin neutralizing agents, flavored substances, aromatic substances, catalysts, wetting agents, chemical elements, metals, salts, ceramics, polymers, gases, liquids, colloids, suspensions, emulsions, plasticizers, swelling agents, solvents, titanium oxide, UV-resistance agents, luminescent agents, antibacterial agents, antistatic agents, salts, indium tin oxide, behentrimonium chloride, cocamidopropyl betaine, phosphoric acid esters, phylethylene glycol ester, polyols, PEDOT:PSS, dinonylnaphthylsulfonic acid, ruthenium metalorganic dye, titanium oxide, titanium dioxide, scratch resistant agents, graphene, copper phthalocyanine, anti-fingerprint agents, anti-fog agents, UV-resistant agents, tinting agents, anti-reflective agents, IR-resistant agents, high reflectivity agents, optical filtration agents, fragrance, de-odorizing agents, resins, lubricants, solubilizing agents, stabilizing agents, surfactants, fluorescent agents, activated charcoal, inks, toner particles, circuit elements, insulators, conductors, conductive fluids, magnetic inclusions, electronic inclusions, plasmonic inclusions, dielectric inclusions, resonant inclusions, luminescent molecules, fluorescent molecules, semiconductors, semiconductor dopants, cavities, inclusions, lenses, metamaterials, cold cathodes, electrodes, nanopyramids, quantum dots, nanocrystals, resonators, sensors, actuators, transducers, circuit elements, transistors, lasers, oscillators, photodetectors, photonic crystals, conjugated polymers, nonlinear elements, metals, ceramics, alloys, composites, multilayers, chemically inert agents, phase-shifting structures, amplifiers, modulators, switches, photovoltaic cells, light emitting diodes, couplers; antiblock and antislip agents: diatomaceous earth, talc, calcium carbonate, silica, and silicates; slip agents and lubricants: fatty acid amides, erucamide, oleamide, fatty acid esters, metallic stearates, waxes, and amide blends; antioxidants: amines, phenolics, organophosphates, thioesters, and deactivators; antistatic agents: cationic antistats, quaternary ammonium, phosphonium, sulfonium, anionic counterstats, inherently conductive polymers, amines, and fatty acid esters; biocides: OBPA (10,10'-oxybisphenoxarsine), amine-neutralized phosphate, zinc-OMADINE (zinc 2-pyridinethianol-1-oxide), 2-n-octyl-4-isothiazolin-3-one, DCOIT, TRICLOSAN, CAPTAN, and FOLPET; light stabilizers: UV absorbers, benzophenone, benzotriazole, benzoates, salicylates, nickel organic complexes, hindered amine light stabilizers (HALS), and nickel compounds, and the like. As will be apparent, the claimed methods are amenable to the embedding of virtually any particle into virtually any materials that is molded.

The materials of the above devices include but are not limited to the following materials, as well as those mentioned in the parent inventions referenced above, which listing includes:

$TiO_2$, C, CdSe, CdS, PbS, $PbSO_4$, $SnO_2$, ZnO, Si, Ru, As, Ni, Te, In, Pt, Pd, Au, Ag, CdTe, Se, Cd, Pb, S, Sn, Zn, Ge, copper indium diselenide (CIS), chromium, iridium, neodymium, itrium, glass, silica, organic fluorescent dyes, or any combination thereof.

EXAMPLE

Fabricating microconcentrators for photovoltaic cells

Using the embedding process described in the parent inventions and herein, we propose embedding metallic nanowires, nanoshells, or bowties as optical nanoantennas able to alter the absorption of incident radiation into photovoltaic cells or photodetectors.

The strong field scattering cross-section and enhancement found in plasmonic structures can enhance light absorption in thin-film solar cells as well as the up-conversion efficiency of ionic nanoparticle metals. Optical absorption in for example amorphous silicon thin film solar cells may be enhanced by as much as a factor of 1.5.

Other applications besides photovoltaics for plasmonic nanoantennas include photonic band gap materials, surface-enhanced Raman spectroscopy (SERS), waveguide devices, electromagnetic cloaking structures, enhanced random lasing, harmonic generation, and medical optics. Silver islands, metallic gratings, triangular, pyramidal, or other textured surfaces on the top layer of a thin film amorphous silicon, microcrystalline silicon, or organic thin film increase device efficiency by enhancing optical absorption and up-conversion. For an up-conversion device, silver nanoislands embedded into a film adjacent to erbium ions enhances their photoluminescence yield when plasmon modes between the silver nanoparticles and erbium ions are coupled. Random or patterned metallic meshes embedded in a transparent substrate with a surface loading above the electric percolation threshold can be used to fabricate transparent conducting electrodes.

New form factors of silicon photovoltaic cells including microconcentrator lenses have been shown to perform with significantly improved fill factors. A cylindrical lens array, which is commercially available, can be used to create a PDMS mold on a glass backing plate. A photocurable liquid formed from silica nanoparticles, silicone-epoxy resin, and a coupling agent can then be poured into the negative PDMS mold. Transparent particles, such as silica nanoparticles, may be included to further boost interfacial adhesion by introducing nano- or micro-scopic roughness between the underlying substrate and the photocurable mold. Plasmonic active front electrode materials may in addition be applied to provide optical and plasmonic concentrating ability.

A two-dimensional photonic crystal structure impregnated in the photoactive bulk heterojunction layer of an organic solar cell (OSC) enhances the quantum efficiency of the device. The bulk heterojunction layer, which can be polythiophene derivative (TDPTD) poly(3-(2-methyl-2-hexylcarbonate) thiophene-co-thiophene) and [6,6]-phenyl-C61-butyric acid methyl ester (PCBM), can be solution cast. A highly columnar photonic crystal array can then be embedded in the surface.

Particles may embed into the surface of the polymer in a luminescent solar concentrator (LSC). These particles may be but are not limited to scatterers, optical nonlinear elements, luminescent agents, optical collectors, nanoantennas, nanotubes, butt couplers, lenses, focusing elements, refracting elements, mirrors, or other structures that facilitate the absorption of incident solar radiation and couple these into waveguide modes in the interior of the LSC. . The LSC comprises at least one layer of a polymer sheet wherein the surfaces of the sheet contained embedded optical elements. If more than one sheet is present, the sheets may be solvent bonded together to form a layered structure.

Significant research efforts have been invested into investigating metallic particles embedded within dielectrics for their waveguiding, energy coupling, and photonic-electronic integration capabilities. These phenomena have created a broad range of novel photonic, electronic, and plasmonic devices, including diffractors, Bragg mirrors, subwavelength resonators, photovoltaic cells, nanoantennas, sensors, circuit elements, photonic crystals, switches, and light emitting diodes. Controllably disposing such additives (e.g., by controlled dispensing of additive-containing fluid or solution) enables patterned particle arrays.

Discrete deposits of embedded metallic particles can also be fused through the use of sintering/heating. This may also be accomplished by redox reactions that cause ions to selectively deposit as bulk metal onto the embedded particles, causing them to grow and fuse together.

EXAMPLE

Cold cathode Devices

The process described above and in related applications can be used to produce cold cathodes, or electron sources. One notable way of accomplishing this would be to embed nanopyramids onto a polymer substrate that is either conducting or made to be conducting through the use of additives such as organic molecules or other additives.

Cathode emission from nanopyramids (suspected to originate from the exposed apex of the pyramid) can be achieved by depositing the nanopyramids in a random way or in a patterned formation (e.g., forming an array) using the techniques and processes and methods described in this application, other referenced applications, and elsewhere. Nanopyramids are chosen in particular because their shape favors exposure of a "sharp" corner upon embedding into the substrate. Other shapes that also lead to the exposure of a "sharp" corner, such as nanocubes, nanostars (starburst-shaped particles), spiked particles, and the like, all of which are applicable in the claimed invention.

EXAMPLE

Fluid Application Methods

Current micro and nanoelectronic device fabrication and treatment methods often use solution-based spray deposition in a vacuum chamber to apply coatings, materials, fluids, and/or particles that impart additional chemical, mechanical, electronic, or optical functionalities to a substrate. The present invention disclosed herein presents an alternative or complementary, single-step, and low-cost process to existing spray deposition techniques for nanoelectronic device fabrication and treatments to control or modify characteristics like the atomized fluid droplet sizes and distribution.

Non-Limiting Example 1

Surface plasmons are excitations of free electrons on the surface of metals under optical excitation; many semiconductor and organic semiconductor systems now incorporate plasmonic passive and active materials. Using the embedding process described herein (or the polymer-softening process described in related applications, incorporated herein by reference in their entirety), embedding particles, molecules, and the like (e.g., nanowires and nanopyramids) to give rise to passive optical nanoantennas that could alter or modify the absorption of incident radiation, photons, and/or light into OPVs.

Non-Limiting Example 2

The methods disclosed in this invention are able to embed intermediate layers of $TiO_2$ particles into and/or onto OPVs. Such particles and layers have the capability of reducing recombination losses, dramatically increasing the device efficiency by as much as 160%. A $TiO_2$ optical blocking layer would be beneficial for example in organic dye-sensitized solar cells.

Non-Limiting Example 3

The methods disclosed in this invention may be applied to luminescent solar concentrators (LSCs). In some embodiments, a polymer softening solution (described in the related applications, incorporated by reference herein) is able to temporarily modify the polymeric substrate surface so that particles may embed into the surface of the polymer in an LSC. These particles may be but are not limited to scatterers, optical collectors, nanoantennas, nanotubes, butt couplers, lenses, focusing elements, refracting elements, mirrors, or other structures that facilitate the absorption of incident solar radiation and couple these into waveguide modes in the interior of the LSC. Such solution-based treatments of polymers via embedding particulate inclusions into the polymeric surface can change the surface impedance, surface conductivity, index of refraction, optical extinction and/or optical transparency of the material in such a way to improve the device performance.

Non-Limiting Example 4

Another aspect of the invention may embody methods to expose an electrostatically charged polymer film to carbon nanotubes. The nanotubes become affixed and embedded in the polymer film via electrostatic interactions to provide a random or determined arrangement of nanotubes supported on the polymer substrate. Subsequently, a contact or several contacts made from electrically conductive materials may be deposited on the polymer film such that some of the nanotubes come into physical contact with the conductive contacts.

Nanotubes connecting two different contacts may participate in photoconduction, as photogenerated electron-hole pairs are free to escape the nanotube and recombine, generating photocurrent that may flow through the rest of the circuit connecting the two contacts of the nanotube. A Schottky barrier for electrons (holes) is created if one contact is composed of a material with a lower (higher) work function than that of the nanotube. Nanotubes inside junction materials may be insulated prior to embedding to prevent electron hole recombination. Alternatively, nanotubes may be coated with plasmonic materials to tune the optical properties and efficiency of the nanostructure.

Multi-walled carbon nanotubes (MWCNTs) have been shown to act as optical nanoantennas, which have the ability to enhance optoelectronic device performance. MWCNTs can be fabricated at low cost and in large scale by plasma-enhanced chemical vapor deposition (PECVD). The bandwidth of the nanoantennas can be tuned to span the entire solar spectrum, or be narrowed to receive or emit only a narrow range of frequencies.

Non-Limiting Example 5

The embedding or implantation of mercury and/or silver nitrate into a semiconductor material for a PV cell has been reported to enhance the absorption of incident energy later released to the solar cell, thereby increasing the electric generation for longer periods of time. Additionally, light transmitting particles may be dispersed, embedded, implanted, or incorporated into the semiconducting layers of a single-junction or multijunction PV cell to facilitate the waveguiding of light within the device.

These compounds along with many other compounds, molecules, and/or particles may be deposited and subsequently embedded into semiconducting layers using the methods outlined in the present invention. The light transmitting particle materials may comprise but are not limited to optical calcite, tumbled clear quartz, colored quartz, clear Herkimer diamond, diamond, danburite, calcite, dolomite, scolecite, kunzite, crystallite, glass, metals, and artificial crystal materials transparent to light. The light transmitting particles may alternatively be used as nanoconcentrator elements which are able to focus or concentrate optical energy into small spatial regions at a semiconductor junction.

Non-Limiting Example 6

Roll-to-roll processing of electronic devices fabricated on a roll of flexible plastic or metal foil have permitted the highly scalable production of large area semiconductor devices. The substrate may comprise a polymeric photoresist which is subsequently patterned via standard photolithography techniques. Such methods can achieve drastic cost savings compared to traditional semiconductor device manufacturing methods. Such solutions involved in this invention has application in the fabrication of OLEDs, organic thin films, OPV cells, inorganic PV cells whose fabrication steps intermediate steps involving polymer photoresists, luminescent solar concentrators, etc. The processes outlined here are compatible with existing techniques, e.g., deposition of nanoparticle inks on polymer substrates via roll-to-roll processing.

EXAMPLE

Polymer Dopants

The present invention also represents an alternative process to functionalize insulating, semiconducting, and metallic psolymers with dopants. These dopants may comprise at least one electron acceptor (or accepting group) to induce or enhance the charge carrier mobility or electrical conductivity of the polymer. The dopants may also comprise at least one electron donor (or donating group). The dopants may comprise any polymer, organometallic compound, complex ion, metal, conductor, crystal, dielectric, semiconductor, or combination thereof. The dopant components may form a mixture, solution, dispersion, or blend. Oxidizing agents will induce p-doping, whereas reducing agents induce n-doping of the polymer either by chemical or electrochemical means, generating mobile charge carriers.

Such techniques may be used in devices including: a semiconductor, electrical conductor, photoconductor, optical device, electronic device, field effect transistor, integrated circuit, thin film transistor, flat panel display, radio frequency identification tag, organic light emitting diode, electroluminescent component, liquid crystal display, photovoltaic device, sensor, actuator, electrode, battery, electrophotographic device, antistatic film, or any combination thereof.

Conductive polymers, such as polyaniline, polythiophene, or polypyrrole, may be used as inks in gravure, flexo, and ink jet printing techniques. Additional dopant materials may be incorporated into the conductive polymers to tune their conductivity. High speed roll-to-roll processes employing polyaniline and polythiophene patterns on polymeric substrates have been demonstrated in industry, enabling the realization of various circuit components, dye sensitized solar cells, and organic solar cells.

EXAMPLE

Electronic Ink and Transparent Conducting Electrodes

Indium tin oxide (ITO) is a common used high performance material for transparent electrodes, for instance, in antireflective coatings and semiconductor devices. The present worldwide shortage of indium has made competing technologies, such as carbon nanotube polymeric thin films or nanocomposites, attractive alternatives. The present invention may be used as a single-step fabrication technique to embed micro and nanoparticles, such as carbon nanotubes and nanofibers, into the surfaces of polymeric substrates for use as transparent electrodes, electronic ink devices, and polymer doping.

In the fabrication of many flexible electronic and/or optical devices, the electrically-active or photoactive layers are often deposited on top of a flexible plastic substrate. The present invention presents a method to superficially embed some of the additives to be deposited into the underlying substrate as a way to decrease the overall thickness of the layers and improve chemical and physical compatibility between the deposition layer and substrate interface.

EXAMPLE

Lighting and Optical Sensing

Quantum dots are increasingly being used in solid state lighting, photovoltaic, biosensing, and nanoelectronics applications for their extraordinary photostability, brightness, broad excitation, narrow emission, long fluorescence lifetimes, and multiplexing capability. Many quantum dots possess yields approaching 100%, making it thousands of times brighter and more sensitive than organic fluorophores. Quantum dots or other nanostructure scatterers can be embedded into the surface of polymeric substrates in order to modify the frequency or amplitude of electromagnetic radiation traveling through the polymeric substrate. For instance, the plastic casing of an LED may be embedded with CdSe quantum dots (appx. 1.5 nm diameter), which can alter the incident radiation frequency to emit in a shifted frequency range, useful to change the colors of an LED. Entire dielectric slabs may likewise be modified to contain surface embedded nanostructure scatterers to change incident UV radiation to emit visible light.

Semiconducting nanocrystal emitters and/or scintillators may be embedded into polymeric substrates using the invention disclosed as sources of electromagnetic radiation, instead of other emitters such as phosphors. Semiconducting nanocrystal emitters have characteristically narrow band emission. This band can also be functionally tuned across the spectrum by altering the size of the nanocrystals, surrounding media, geometry, and configuration with other resonant elements in film.

What is claimed:

1. A method of producing a coated article, comprising:
   applying a fluid and a population of metallic nanowires to a wet coating material disposed on a transparent polymeric substrate, wherein:
      the transparent polymeric substrate comprises a thermoset polymer, and
      the wet coating material comprises a thermoplastic polymer selected from the group consisting of polycarbonate and polyacrylate;
   removing at least a portion of the fluid after the metallic nanowires are applied to the wet coating material and before the wet coating material is dried, wherein the removing at least a portion of the fluid is under a condition of applying an electric field to maintain one or more positions of the metallic nanowires within the wet coating material; and
   drying the wet coating material so as to give rise to a coated article, wherein:
      the metallic nanowires are at least partially embedded in a surface of the dried coating material,
      a loading of the metallic nanowires in the dried coating material is above an electric percolation threshold,
      neighboring ones of the metallic nanowires are in electronic contact with one another, and
      the coated article is a transparent conducting electrode.

2. The method of claim 1, wherein the wet coating material comprises poly(methyl methacrylate).

3. The method of claim 1, wherein at least some of the metallic nanowires are suspended in the fluid during application.

4. The method of claim 1, wherein the fluid softens the wet coating material, thereby facilitating embedding of the metallic nanowires into the surface.

5. The method of claim 1, wherein a velocity causes the metallic nanowires in the fluid, when applied to the wet coating material, to impact the wet coating material, thereby facilitating embedding of the metallic nanowires into the surface.

6. The method of claim 1, further comprising disposing the population of metallic nanowires in the fluid by mixing, sonicating, shaking, vibrating, flowing, stirring, agitating, or any combination thereof.

7. The method of claim 1, wherein the fluid comprises a gas, a liquid, a supercritical fluid, or a combination thereof.

8. The method of claim 1, wherein the fluid comprises a solvent, an aqueous solution, an ionic solution, a non-polar solvent, an organic solvent, a polar solvent, an aprotic solvent, a protic solvent, an inorganic solvent, an ionic fluid, a polar aprotic solvent, a polar protic solvent, a solution comprising a salt, or any combination thereof.

9. The method of claim 1, wherein the fluid comprises a salt, a surfactant, a stabilizer, or any combination thereof.

10. The method of claim 1, wherein the fluid comprises a volatile component.

11. The method of claim 1, wherein the fluid is removed by heating, flash-heating, distillation, evaporation, suction, vacuum, or any combination thereof.

12. The method of claim 1, wherein the fluid comprises at least one agent capable of at least partially inhibiting agglomeration of the metallic nanowires.

13. The method of claim 1, further comprising fusing at least some of the metallic nanowires together.

14. The method of claim 1, wherein the fluid is characterized as being a solvent to the wet coating material.

15. The method of claim 1, wherein applying the fluid comprises spraying, electrostatic spraying, spin casting, dipping, painting, dripping, brushing, immersing, flowing, exposing, pouring, rolling, curtaining, wiping, printing, pipetting, ink-jet printing, or any combination thereof.

16. The method of claim 1, further comprising moving at least one of the transparent polymeric substrate or the fluid relative to the other.

17. The method of claim 1, wherein the metallic nanowires include at least one metallic nanowire that is partially embedded in the dried coating material to an extent of not more than 80% of a diameter of the metallic nanowire.

18. The method of claim 1, wherein the metallic nanowires include at least one metallic nanowire that is partially embedded in the dried coating material to an extent of not more than 50% of a diameter of the metallic nanowire.

19. The method of claim 1, wherein at least one of the metallic nanowires comprises silver.

20. The method of claim 1, wherein the metallic nanowires are, on average, embedded to an extent of not more than 100% of a characteristic diameter of the metallic nanowires.

21. The method of claim 1, wherein at least one of the metallic nanowires is fully embedded below the surface of the dried coating material.

22. The method of claim 1, wherein applying the electric field causes the metallic nanowires to embed into the wet coating material.

23. The method of claim 1, wherein applying the fluid to the wet coating material comprises contacting a roller against the wet coating material such that the metallic nanowires are at least partially embedded in the wet coating material.

24. The method of claim 1, wherein the embedded metallic nanowires provide electronic communication with an environment exterior to the dried coating material.

25. The method of claim 1, wherein the metallic nanowires are, on average, embedded to an extent of more than 100% of a characteristic diameter of the metallic nanowires but localized near the surface of the dried coating material.

26. The method of claim 1, further comprising forming an electrically conductive contact in electronic communication with at least some of the metallic nanowires.

27. The method of claim 1, further comprising depositing an electrically conductive material over the transparent polymeric substrate to form a contact, wherein the contact is in electronic communication with at least some of the metallic nanowires.

28. A method of producing a coated article, comprising:
applying a fluid and a population of metallic nanowires to a wet coating material disposed on a substrate;
removing at least a portion of the fluid after the metallic nanowires are applied to the wet coating material and before the wet coating material is dried, wherein the removing at least a portion of the fluid is under a condition of applying an electric field to maintain one or more positions of the metallic nanowires within the wet coating material; and
drying the wet coating material so as to give rise to a coated article, wherein:
the metallic nanowires are at least partially embedded in a surface of the dried coating material,
a loading of the metallic nanowires in the dried coating material is above an electric percolation threshold,
neighboring ones of the metallic nanowires are in electronic contact with one another, and
the coated article is a transparent conducting electrode.

29. The method of claim 28, wherein the fluid softens the wet coating material, thereby facilitating embedding of the metallic nanowires into the surface.

30. The method of claim 29, wherein a velocity causes the metallic nanowires in the fluid, when applied to the wet coating material, to impact the wet coating material, thereby facilitating embedding of the metallic nanowires into the surface.

31. The method of claim 28, wherein the fluid comprises a gas, a liquid, a supercritical fluid, or a combination thereof.

32. The method of claim 28, wherein the fluid is removed by heating, flash-heating, distillation, evaporation, suction, vacuum, or any combination thereof.

33. A method of producing a coated article, comprising:
applying a fluid and a population of metallic nanowires to a wet coating material disposed on a substrate;
removing at least a portion of the fluid after the metallic nanowires are applied to the wet coating material and before the wet coating material is dried, wherein the removing at least a portion of the fluid is under a condition of applying an gradient to drive the metallic nanowires into the wet coating material; and
drying the wet coating material so as to give rise to a coated article, wherein:
the metallic nanowires are at least partially embedded in a surface of the dried coating material,
a loading of the metallic nanowires in the dried coating material is above an electric percolation threshold,
neighboring ones of the metallic nanowires are in electronic contact with one another, and
the coated article is a transparent conducting electrode.

34. The method of claim 33, wherein the gradient further maintains one or more positions of the metallic nanowires relative to the wet coating material.

35. The method of claim 33, wherein the gradient is an electric field.

* * * * *

UNITED STATES PATENT AND TRADEMARK OFFICE
CERTIFICATE OF CORRECTION

PATENT NO. : 10,105,875 B2
APPLICATION NO. : 13/059963
DATED : October 23, 2018
INVENTOR(S) : Michael Eugene Young et al.

It is certified that error appears in the above-identified patent and that said Letters Patent is hereby corrected as shown below:

On the Title Page

Item (73) Assignee: please delete "CAM Holding Corporation, Tortola (VG)", and insert --TPK HOLDING CO., LTD., Grand Cayman (KY)--

Signed and Sealed this
Thirteenth Day of September, 2022

Katherine Kelly Vidal
*Director of the United States Patent and Trademark Office*